United States Patent
Jeon et al.

(10) Patent No.: US 9,087,704 B2
(45) Date of Patent: Jul. 21, 2015

(54) SEMICONDUCTOR DEVICES AND METHODS OF MANUFACTURING THE SEMICONDUCTOR DEVICE

(71) Applicant: Samsung Electronics Co., Ltd., Suwon-Si, Gyeonggi-Do (KR)

(72) Inventors: Woo-chul Jeon, Daegu (KR); Young-hwan Park, Seoul (KR); Ki-yeol Park, Suwon-si (KR); Jai-kwang Shin, Anyang-si (KR); Jae-joo Oh, Seongnam-si (KR); Jong-bong Ha, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 42 days.

(21) Appl. No.: 13/790,319

(22) Filed: Mar. 8, 2013

(65) Prior Publication Data

US 2014/0048850 A1 Feb. 20, 2014

(30) Foreign Application Priority Data

Aug. 16, 2012 (KR) .................. 10-2012-0089671

(51) Int. Cl.
| | |
|---|---|
| *H01L 29/66* | (2006.01) |
| *H01L 29/84* | (2006.01) |
| *H01L 21/338* | (2006.01) |
| *H01L 27/06* | (2006.01) |
| *H01L 21/8252* | (2006.01) |

(52) U.S. Cl.
CPC ........ *H01L 27/0605* (2013.01); *H01L 21/8252* (2013.01)

(58) Field of Classification Search
CPC .............. H01L 27/06; H01L 27/06054; H01L 27/0605; H01L 21/28264; H01L 21/8252
USPC ..................... 257/195, 76; 438/172
See application file for complete search history.

(56) References Cited

U.S. PATENT DOCUMENTS

| | | | |
|---|---|---|---|
| 7,719,055 B1 | 5/2010 | McNutt et al. | |
| 2008/0142921 A1* | 6/2008 | Isobe et al. | 257/476 |
| 2009/0032820 A1 | 2/2009 | Chen | |
| 2010/0019279 A1 | 1/2010 | Chen et al. | |
| 2011/0057196 A1 | 3/2011 | Chang et al. | |
| 2011/0210337 A1* | 9/2011 | Briere | 257/76 |
| 2012/0280247 A1* | 11/2012 | Cheah et al. | 257/76 |

FOREIGN PATENT DOCUMENTS

| | | |
|---|---|---|
| KR | 20050087871 A | 8/2005 |
| KR | 20100015747 A | 2/2010 |
| KR | 20110070313 A | 6/2011 |

\* cited by examiner

*Primary Examiner* — Julio J Maldonado
*Assistant Examiner* — Moazzam Hossain
(74) *Attorney, Agent, or Firm* — Harness, Dickey & Pierce, P.L.C.

(57) ABSTRACT

According to example embodiments, a semiconductor device may include a high electron mobility transistor (HEMT) on a first region of a substrate, and a diode on a second region of the substrate. The HEMT may be electrically connected to the diode. The HEMT and the diode may be formed on an upper surface of the substrate such as to be spaced apart from each other in a horizontal direction. The HEMT may include a semiconductor layer. The diode may be formed on another portion of the substrate on which the semiconductor layer is not formed. The HEMT and the diode may be cascode-connected to each other.

44 Claims, 15 Drawing Sheets

SEMICONDUCTOR DEVICES AND METHODS OF MANUFACTURING THE SEMICONDUCTOR DEVICE

CROSS-REFERENCE TO RELATED APPLICATIONS

This application claims the benefit of Korean Patent Application No. 10-2012-0089671, filed on Aug. 16, 2012, in the Korean Intellectual Property Office, the disclosure of which is incorporated herein in its entirety by reference.

BACKGROUND

1. Field

Example embodiments relate to semiconductor devices and/or methods of manufacturing the same, and more particularly, to semiconductor devices including a high electron mobility transistor (HEMT), and/or methods of manufacturing the semiconductor devices.

2. Description of the Related Art

Various power conversion systems may include a device that controls the flow of a current through ON/OFF switching operations, for example a power device. The efficiency of a power conversion system may depend on the efficiency of a power device in the power conversion system.

Many power devices that are currently commercialized include a power metal-oxide-semiconductor field-effect transistor (MOSFET), an insulated gate bipolar transistor (IGBT), or a diode, which are based on silicon. However, due to limitations in the physical property of silicon and in manufacturing processes, it may be difficult to increase the efficiency of a silicon-based power device. To overcome these limitations, research and development for increasing the conversion efficiency of a power conversion system by applying a group III-V based compound semiconductor to a power device has been conducted. For example, it has been attempted to apply a Schottky barrier diode using a gallium nitride (GaN) semiconductor to a power device in order to increase the conversion efficiency.

However, since a GaN semiconductor has a relatively high energy bandgap, a Schottky barrier diode based on the GaN semiconductor may have a high turn-on voltage in a forward direction. For example, a turn-on voltage of a Schottky barrier diode based on a GaN semiconductor is about 1.5 V which is a relatively high value. In this regard, there is a demand for a device capable of reducing power consumption by decreasing a turn-on voltage to about 1 V or less, and still exhibiting good reverse characteristics.

SUMMARY

Example embodiments relate to semiconductor devices that may have low power consumption and good operational characteristics.

Example embodiments relate to semiconductor devices that may have appropriately low turn-on voltages and have good reverse characteristics.

Example embodiments relate to semiconductor devices that include a plurality of different devices on a single substrate.

Example embodiments relate to methods of manufacturing semiconductor devices.

Additional aspects will be set forth in part in the description which follows and, in part, will be apparent from the description, or may be learned by practice of example embodiments.

According to example embodiments, a semiconductor device includes a high electron mobility transistor (HEMT) on a first region of a substrate, and a diode on a second region of the substrate. The HEMT includes a semiconductor layer. The diode is electrically connected to the HEMT.

In example embodiments, the HEMT may include a source electrode electrically connected to a first region of the semiconductor layer, a drain electrode electrically connected to a second region of the semiconductor layer, and a gate electrode on the semiconductor layer between the source electrode and the drain electrode.

In example embodiments, an upper surface of the substrate may contact one of the source electrode and the drain electrode.

In example embodiments, the source electrode may be spaced apart from the substrate, and the drain electrode may contact the substrate and the semiconductor layer.

In example embodiments, the drain electrode of the HEMT may serve as a cathode of the diode.

In example embodiments, the semiconductor layer may include a channel layer and a channel supply layer.

In example embodiments, the semiconductor layer may include a gallium nitride (GaN)-based material.

In example embodiments, the diode may be a Schottky diode.

In example embodiments, the diode may include an anode which forms a Schottky contact with the substrate; and a cathode that is spaced apart from the anode in a horizontal direction.

In example embodiments, the anode may be spaced apart from the semiconductor layer, and the cathode may be between the anode and the semiconductor layer.

In example embodiments, the cathode may be the drain electrode of the HEMT.

In example embodiments, the cathode may contact the substrate and the semiconductor layer.

In example embodiments, the substrate may be a silicon substrate.

In example embodiments, the HEMT may be a GaN-based HEMT, and the diode may be a silicon-based Schottky diode.

In example embodiments, the HEMT and the diode may be cascode-connected to each other. The gate electrode of the HEMT may be connected to the anode of the diode, and the drain electrode of the HEMT may be connected to a cathode of the diode. The gate electrode of the HEMT may be closer to the drain electrode of the HEMT than to the source electrode of the HEMT. The HEMT may be a normally-on device.

In example embodiments, the source electrode of the HEMT may be connected to the anode of the diode, and the drain electrode of the HEMT may be connected to the cathode of the diode. The gate electrode of the HEMT may be disposed closer to the source electrode than to the drain electrode. The HEMT may be a normally-off device. The diode may be a free wheeling diode (FWD).

In example embodiments, the HEMT that includes the semiconductor layer on the first region of the substrate may be a first HEMT that includes a first semiconductor layer on the first region of the substrate, and the semiconductor device may further include a second HEMT that is electrically connected to the diode, where the second HEMT is on a second region of the substrate, and the second HEMT includes a second semiconductor layer that is spaced apart from the first semiconductor layer of the first HEMT.

In example embodiments, the first HEMT and the second HEMT may be symmetrical about the diode.

In example embodiments, the semiconductor device may further include a first impurity region in the substrate that corresponds to a first edge of the anode of the diode, and a second impurity region in the substrate that corresponds to a second edge of the anode of the diode.

In example embodiments, the semiconductor device may further include at least one third impurity region in the substrate between the first impurity region and the second impurity region of the substrate.

The semiconductor device may further include a first doped region of a first conductive type in the substrate and below the cathode of the diode. The cathode and the first doped region of the substrate may form an ohmic-contact between the cathode and the substrate.

In example embodiments, semiconductor device may further include a second doped region in the substrate between the first doped region and the semiconductor layer. The second doped region and the first doped region may form a PN junction.

According to example embodiments, a power device may include the semiconductor device.

According to example embodiments, a method of manufacturing a semiconductor device includes forming a high election mobility transistor (HEMT) on a first region of a substrate, and forming a diode on a second region of the substrate. The HEMT includes a semiconductor layer. The diode is electrically connected to the HEMT.

The forming the HEMT may include forming a semiconductor material layer on the substrate, and exposing a region of the substrate by etching a portion of the semiconductor material layer. The forming the diode may include forming the diode on the exposed region of the substrate.

In example embodiments, the semiconductor layer may include a channel layer and a channel supply layer.

In example embodiments, the semiconductor layer may include a GaN-based material.

In example embodiments, the forming of the HEMT may include forming a source electrode and a drain electrode that are electrically connected to a first region and a second region of the semiconductor layer, respectively, and forming a gate electrode on the semiconductor layer between the source electrode and the drain electrode.

In example embodiments, the forming the source electrode may include forming the source electrode arranged apart from the substrate, and the forming the drain electrode may include forming the drain electrode arranged to contact the substrate and the semiconductor layer.

In example embodiments, the drain electrode may serve as a cathode of the diode.

In example embodiments, the forming the diode may include forming a Schottky diode.

In example embodiments, the forming the diode may include forming an anode that forms a Schottky contact with the substrate, and forming a cathode that is spaced apart from the anode in a horizontal direction.

In example embodiments, the forming the anode may include forming the anode arranged apart from the semiconductor layer, and the forming the cathode may include forming the cathode between the anode and the semiconductor layer.

In example embodiments, the forming the cathode may include forming the cathode to contact the substrate and the semiconductor layer, and the cathode may serve as the drain electrode of the HEMT.

In example embodiments, the substrate may be a silicon substrate.

In example embodiments, the forming the HEMT and the forming the diode may include forming the HEMT and HEMT and the diode as cascode-connected to each other. The gate electrode of the HEMT may be connected to the anode of the diode, and the drain electrode of the HEMT may be connected to the cathode of the diode. The HEMT may be a normally-on device.

In example embodiments, the source electrode of the HEMT may be connected to the anode of the diode, and the drain electrode of the HEMT may be the cathode of the diode. The HEMT may be a normally-off device. The diode may be an FWD.

In example embodiments, the forming the HEMT on the first region of the substrate may include forming the HEMT as a first HEMT that includes a first semiconductor layer on the first region of the substrate. In example embodiments, the method may further include forming a second HEMT that is on the substrate and electrically connected to the diode. The second HEMT may include a second semiconductor layer that is spaced apart from the first semiconductor layer of the first HEMT.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating principles of inventive concepts. In the drawings.

DETAILED DESCRIPTION

Figure 1:
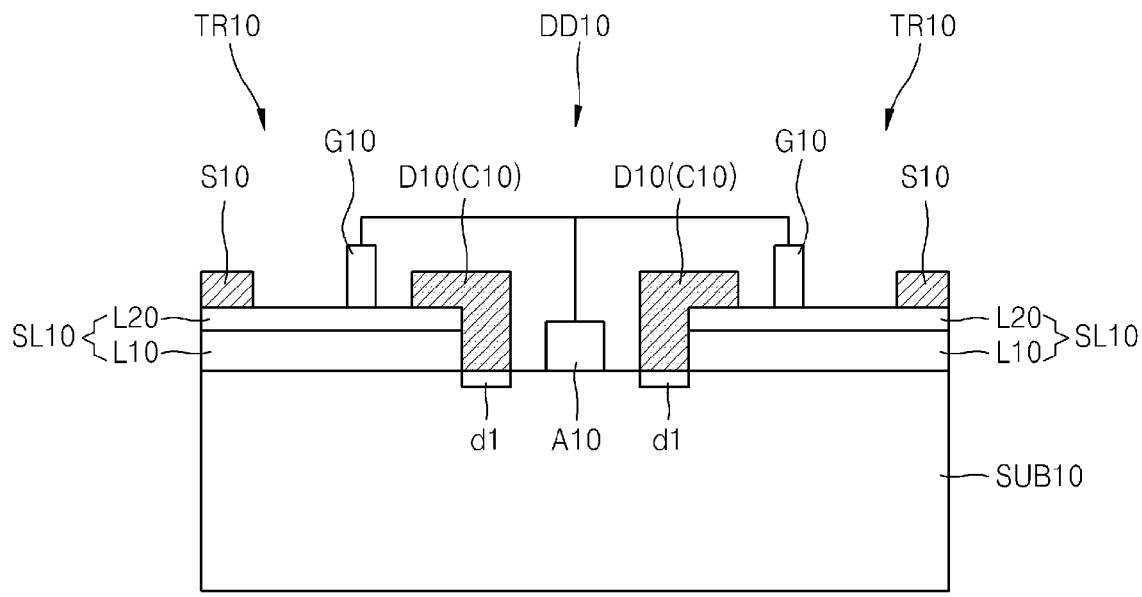
FIG. 1 is a cross-sectional view of a semiconductor device according to example embodiments.

Various example embodiments will now be described more fully with reference to the accompanying drawings in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a semiconductor device according to example embodiments.

Referring to FIG. 1, at least one semiconductor layer SL10 may be formed on a region of a substrate SUB10. A case where two semiconductor layers SL10 are formed apart from each other is illustrated herein. One of the two semiconductor layers SL10 may be referred to as a first semiconductor layer and the other may be referred to as a second semiconductor layer. The substrate SUB10 may be, for example, a silicon substrate. The substrate SUB10 may be an n-type silicon substrate (e.g., an n-Si substrate) or a p-type silicon substrate (e.g., a p-Si substrate). Each semiconductor layer SL10 may include a group III-V based semiconductor. For example, each semiconductor layer SL10 may include a gallium nitride (GaN) based material (semiconductor). Each semiconductor layer SL10 may have a multi-layered structure including at least two layers. Each semiconductor layer SL10 may include a first layer L10 and a second layer L20. The first layer L10 may be formed between the substrate SUB10 and the second layer L20. The first layer L10 may be a channel layer, and the second layer L20 may be a channel supply layer. The first layer L10 may include a GaN-based material (e.g., GaN). In this case, the first layer L10 may be an undoped GaN layer, but in some cases, the first layer L10 may be a GaN layer doped with impurities. The second layer L20 may be a semiconductor layer different from the first layer L10. The second layer L20 may be a layer that induces a 2-dimensional electron gas (2DEG) (not shown) within the first layer L10. The 2DEG may be formed in a portion of the first layer L10 that is close to an interface between the first layer L10 and the second layer L20. The second layer L20 may include a material (semiconductor) having different polarization characteristics and/or a different energy bandgap and/or a different lattice constant from the first layer L10. The second layer L20 may include a material (semiconductor) having higher polarizability and/or a larger energy bandgap than the first layer L10. For example, the second layer L20 may have a monolayered or multi-layered structure including at least one material selected from nitrides containing at least one of aluminum (Al), gallium (Ga), indium (In), and boron (B). In more detail, the second layer L20 may have a mono-layered or multi-layered structure including at least one of various materials, such as, AlGaN, AlInN, InGaN, AlN, and AlInGaN. The second layer L20 may be an undoped layer, but in some cases, the second layer L10 may be a layer doped with impurities. A thickness of the second layer L20 may be several tens of nm or less. For example, the thickness of the second layer L20 may be about 50 nm or less.

At least one high electron mobility transistor (HEMT) TR10 may be formed that includes one of the semiconductor layers SL10. The HEMT TR10 may be a normally-on device. The HEMT TR10 may include a source electrode S10 electrically connected to a first region of the semiconductor layer SL10, a drain electrode D10 electrically connected to a second region of the semiconductor layer SL10, and a gate electrode S10 formed on a region of the semiconductor layer SL10 between the source electrode S10 and the drain electrode D10. The drain electrode D10 may be disposed close to an anode A10 which will be described later. The drain electrode D10 may be located between the source electrode S10 and the anode A10. In other words, the drain electrode D10 may be disposed closer to the anode A10 than the source electrode S10 is. The drain electrode D10 may contact an upper surface of the substrate SUB10 while contacting the semiconductor layer SL10. In this case, the drain electrode D10 may extend over the semiconductor layer SL10 while contacting an upper surface of the substrate SUB10 and a lateral surface of the semiconductor layer SL10. The drain electrode D10 may form an ohmic-contact with the substrate SUB10. To this end, a doped region d1 may be formed in a region of the substrate SUB10 that contacts the drain electrode D10. The doped region d1 may be doped with impurities at a relatively high concentration compared to the substrate. When the substrate SUB10 is n-type, the doped region d1 may be a region doped with n-type impurities at a high concentration (e.g., an n+ region). When the substrate SUB10 is p-type, the doped region d1 may be a region doped with p-type impurities at a high concentration (e.g., a p+ region). The source electrode S10 may be disposed on an upper surface of the semiconductor layer SL10 and may be spaced away from the substrate SUB10. The terms for the source electrode S10 and the drain electrode D10 herein are given based on the direction of a current, and the functions of the source electrode S10 and the drain electrode D10 may be switched when not considering the direction of a current.

The gate electrode G10 may be disposed closer to the drain electrode D10 than the source electrode S10. In other words, a distance between the gate electrode G10 and the drain electrode D10 may be shorter than that between the gate electrode G10 and the source electrode S10. Such an arrangement of the gate electrode G10 closer to the drain electrode D10 than the source electrode S10 may contribute to an improvement in withstand voltage characteristics of the semiconductor device. However, the arrangement of the gate electrode G10 is not limited thereto, and a relationship between the distances between the source electrode S10 and the gate electrode G10 and the drain electrode D10 and the gate electrode G10 may vary.

A diode DD10 may be formed on a region of the substrate SUB10 that is not covered with the semiconductor layer SL10. In example embodiments, when the two semiconductor layers SL10 are formed apart from each other, the diode DD10 may be formed between a region of the substrate SUB10 between the two semiconductor layers SL10. The diode DD10 may be a Schottky diode (e.g., a Schottky barrier diode). The diode DD10 may include the anode A10, which forms a Schottky barrier with the substrate SUB10, namely, forms a Schottky contact with the substrate SUB10. The anode A10 may be a Schottky electrode (or a Schottky metal). When the substrate SUB10 is a silicon substrate, the diode DD10 may be a silicon-based diode. The diode DD10 may be a silicon-based Schottky diode (e.g., a silicon-based Schottky barrier diode). The drain electrodes D10 may serve as cathodes C10 of the diode DD10. Accordingly, the cathode C10 of the diode DD10 may be spaced apart from the anode A10 in a horizontal direction. The anode A10, the cathode C10 and a region of the substrate SUB10 therebetween may constitute the diode DD10.

The diode DD10 and the HEMT TR10 may be electrically connected to each other. In more detail, the diode DD10 and the HEMT TR10 may be cascode-connected to each other. In this case, the gate electrode G10 of the HEMT TR10 may be connected to the anode A10 of the diode DD10, and the drain electrode D10 of the HEMT TR10 may be connected to the cathode C10 of the diode DD10. According to example embodiments, the drain electrode D10 and the cathode C10 may be considered an integrated single component. In FIG. 1, connecting lines connecting the anode A10 and the gate electrode G10 indicate that the anode A10 and the gate electrode G10 are electrically connected to each other. The same applies to the other drawings.

The HEMT TR10 may be disposed on either side of the anode A10, and accordingly one of the two HEMTs TR10 may be referred to as a first HEMT and the other may be referred to as a second HEMT. The two HEMTs TR10 may be symmetrical about the anode A10. In this case, the single diode DD10 is shared by the two HEMTs TR10.

Figure 2:
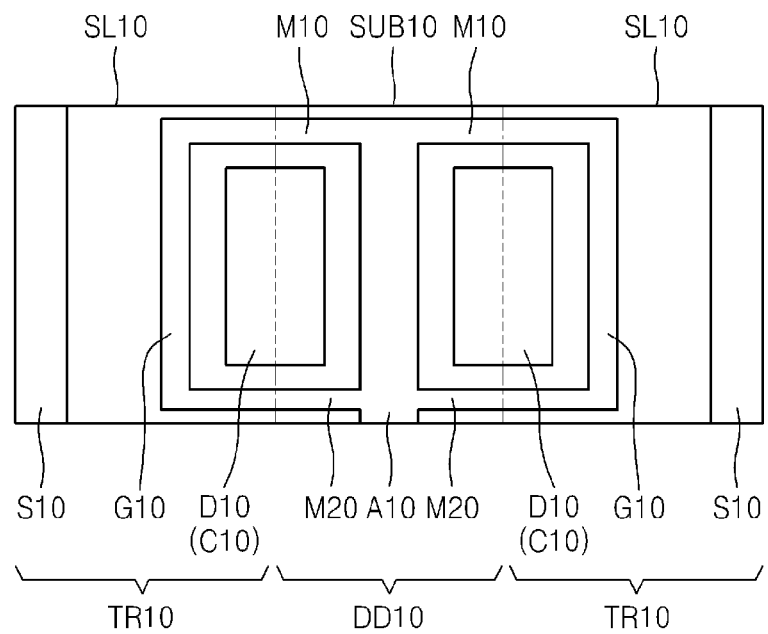
FIG. 2 is a plan view of an example embodiment of a planar structure of the semiconductor device illustrated in FIG. 1.

FIG. 2 is a plan view of an example embodiment of a planar structure of the semiconductor device illustrated in FIG. 1.

Referring to FIG. 2, the two semiconductor layers SL10 may be disposed apart from each other, and the two HEMTs TR10 may be formed on the two semiconductor layers SL10, respectively. Each of the HEMTs TR10 may include the source electrode S10, the drain electrode D10, and the gate electrode G10. The drain electrode D10 may contact the semiconductor layer SL10 and also contacts an upper surface of a portion of the substrate SUB10 adjacent to the semiconductor layer SL10. The drain electrode D10 may have a rectangular shape or a quasi-rectangular shape. The drain electrode D10 may serve as the cathode C10 of the diode DD10. The source electrode S10 may be spaced apart from the drain electrode D10 with the gate electrode G10 interposed therebetween.

The diode DD10 may be disposed on a region of the substrate SUB10 between the two semiconductor layers SL10. The diode DD10 may include the anode A10 which forms a Schottky contact with the substrate SUB10. The diode DD10 may also include the cathodes C10 (e.g., the drain electrode D10) horizontally spaced apart from the anode A10.

The gate electrode G10 of the HEMT TR10 may be connected to the anode A10 of the diode DD10. As depicted in FIG. 2, connecting units M10 and M20 may be disposed to connect the gate electrode G10 to the anode A10. The connecting unit M10 is a first connecting unit M10 that connects one end of the gate electrode G10 to the anode A10, and the connecting unit M20 is a second connecting unit M20 that connects the other end of the gate electrode G10 to the anode A10. The gate electrode G10, the anode A10, and the first and second connecting units M10 and M20 connecting the gate electrode G10 to the anode A10 may form a shape that surrounds the drain electrode D10 (for example, a rectangular frame shape). The two HEMTs TR10 formed on the two semiconductor layers SL10 may be symmetrical about the anode A10.

Figure 3:
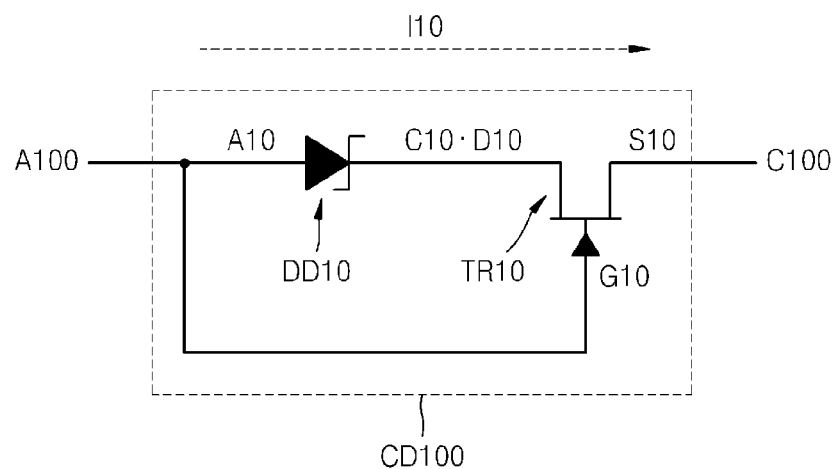
FIG. 3 is a circuit diagram illustrating a connection relationship between a high electron mobility transistor (HEMT) and a diode illustrated in FIG. 1.

FIG. 3 is a circuit diagram illustrating a connection relationship between the HEMT TR10 and the diode DD10 of FIG. 1.

Referring to FIG. 3, the gate electrode G10 of the HEMT TR10 may be connected to the anode A10 of the diode DD10, and the drain electrode D10 of the HEMT TR10 may be connected to the cathode C10 of the diode DD10. As such, a combination of the HEMT TR10 and the diode DD10 (hereinafter, referred to as a combination device CD100) may operate like a single diode. In this case, an end of the combination device CD100 which is close to the anode A10 may be referred to as an anode A100 of the combination device CD100, and another end of the combination device CD100 which is close to the source electrode S10 may be referred to as a cathode C100 of the combination device CD100. A current I10 may flow from the anode A100 of the combination device CD100 to the cathode C100 thereof.

According to example embodiments, a turn-on voltage of the combination device CD100 may be determined by the diode DD10. Since the HEMT TR10 may be a normally-on device, when the diode DD10 is turned on, the combination device CD100 may be turned on. Accordingly, the turn-on voltage of the combination device CD100 may be determined by the diode DD10. When the diode DD10 is a silicon-based Schottky diode, the turn-on voltage of the diode DD10 may be low, that is, about 0.4 V to about 0.7 V. Accordingly, the turn-on voltage of the combination device CD100 may also be low, that is, about 0.4 V to about 0.7 V.

Reverse-direction characteristics of the combination device CD100 may be determined by the HEMT TR10. When the HEMT TR10 is a device based on a GaN-based material, the HEMT TR10 may have good reverse-direction characteristics. In other words, a reverse leakage current of the HEMT TR10 may be very low, and withstand voltage characteristics thereof may be very good. When a strong reverse voltage of about several tens to several hundreds of minus(−) V is applied to the combination device CD100, the HEMT TR10 is in an OFF state (since the strong reverse voltage is less than a threshold voltage of the HEMT TR10), and thus the reverse-direction characteristics of the combination device CD100 may be determined by the HEMT TR10. Therefore, a reverse leakage current of the combination device CD100 may be similar to a cut-off leakage current of the HEMT TR10, and withstand voltage characteristics of the combination device CD100 may be similar to that of the HEMT TR10. Accordingly, the combination device CD100 may have good reverse-direction characteristics.

As described above, a semiconductor device according to example embodiments, namely, the combination device CD100, may have both advantages of the diode DD10 based on the material of the substrate SUB10 and advantages of the HEMTs TR10 based on the material of the semiconductor layers SL10. In other words, the semiconductor device may have a low turn-on voltage and still have good reverse characteristics.

Moreover, since a semiconductor device according to example embodiments, namely, the combination device CD100, may be formed on the single substrate SUB10 as illustrated in FIG. 1, it may be easily manufactured at reduced costs, and may be easily scaled down. If a HEMT and a diode are formed on a first substrate and a second substrate, respectively, and then the HEMT and the diode are connected to each other in a packaging stage, the manufacturing costs thereof may increase, and a size of a packaged device (e.g., a semiconductor device) may increase. However, according to example embodiments, since a semiconductor device is manufactured by forming two different devices, namely, the HEMT TR10 and the diode DD10, on the single substrate SUB10 and combining them together, the semiconductor device may be easily manufactured at reduced costs and may be scaled down, as described above.

Various modifications may be made to the structure of FIG. 1. For example, a gate insulation layer may be further disposed between the semiconductor layer SL10 and the gate electrode G10. This example is illustrated in FIG. 4.

Figure 4:
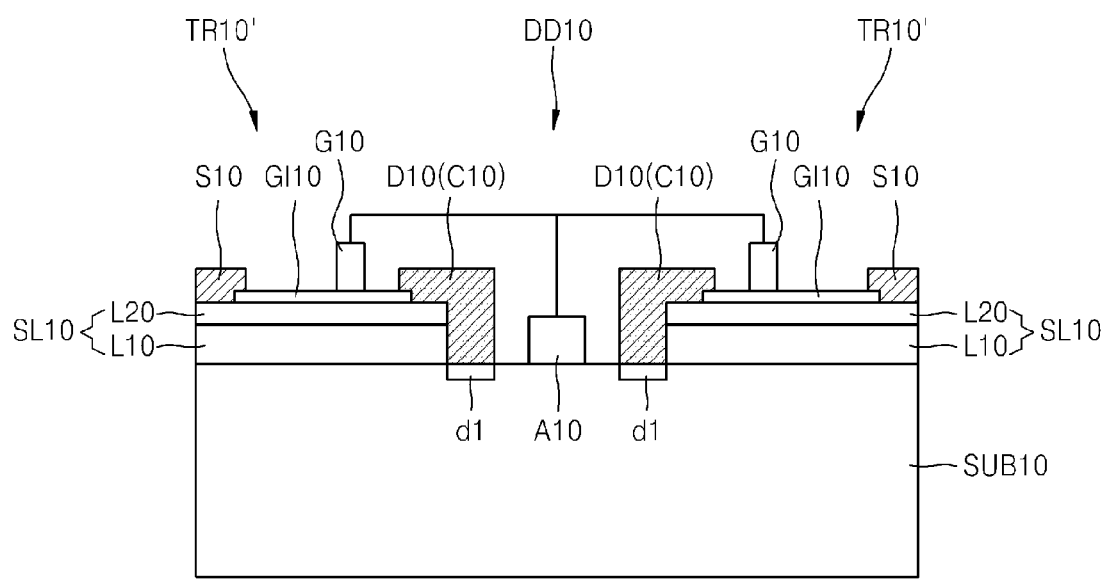
FIG. 4 is a cross-sectional view of a semiconductor device according to example embodiments.

Referring to FIG. 4, a HEMT TR10' may further include a gate insulation layer GI10 between the semiconductor layer SL10 and the gate electrode G10. The gate insulation layer GI10 may include, for example, at least one of $Al_2O_3$, $SiO_x$, $Si_xN_y$, $Sc_2O_3$, AlN, $Ga_2O_3$, $Gd_2O_3$, $AlxGa_{2(1-x)}O_3$, MgO, and a combination of these materials. Although not stated above, any gate insulation layer material may be used as a material used to form the gate insulation layer GI10, as long as it is usable in a general transistor. The HEMT TR10' according to example embodiments may be referred to as a metal-insulator-semiconductor (MIS) type HEMT. One end of the gate insulation layer GI10 may be positioned between the source electrode S10 and the semiconductor layer SL10, and similarly, the other end of the gate electrode GI10 may be positioned between the drain electrode D10 and the semiconductor layer SL10. In other words, the source electrode S10 and the drain electrode D10 may be formed to cover the both ends of the gate insulation layer GI10, respectively.

Figure 5:
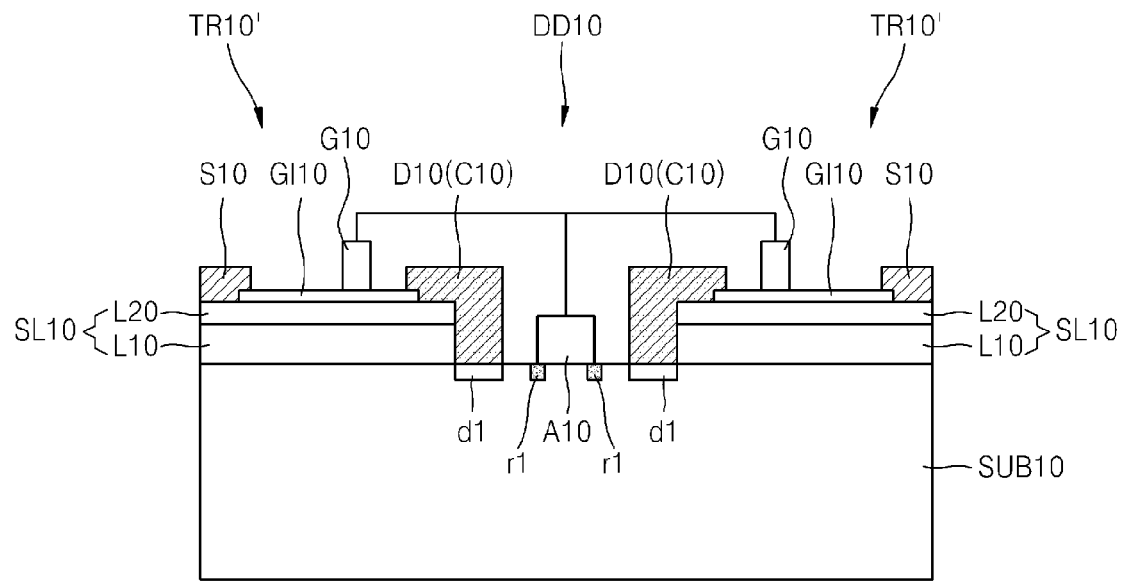
FIG. 5 is a cross-sectional view of a semiconductor device according to example embodiments.

According to example embodiments, impurity regions may be included in regions of the substrate SUB10 corresponding to edge portions of the anode A10 in the structure of FIGS. 1 and 4. An example thereof is illustrated in FIG. 5. FIG. 5 illustrates an example where impurity regions r1 are further included in the structure of FIG. 4.

Referring to FIG. 5, the impurity regions r1 may be formed in the regions of the substrate SUB10 corresponding to the both edge portions of the anode A10, respectively. The impurity regions r1 may be regions doped with impurities of an opposite type to the conductive type of the substrate SUB10 at a high concentration. When the substrate SUB10 is n-type, the impurity regions r1 may be p+ regions. When the substrate SUB10 is p-type, the impurity regions r1 may be n+ regions. The impurity regions r1 may reduce (or effectively prevent) concentration of an electric field on the regions of the substrate SUB10 corresponding to the both edge portions of the anode A10. In other words, the impurity regions r1 may function similar to a guard ring. Since the concentration of the electric field may be reduced (or effectively prevented) by the impurity regions r1, characteristics of a semiconductor device may improve accordingly.

Figure 6:
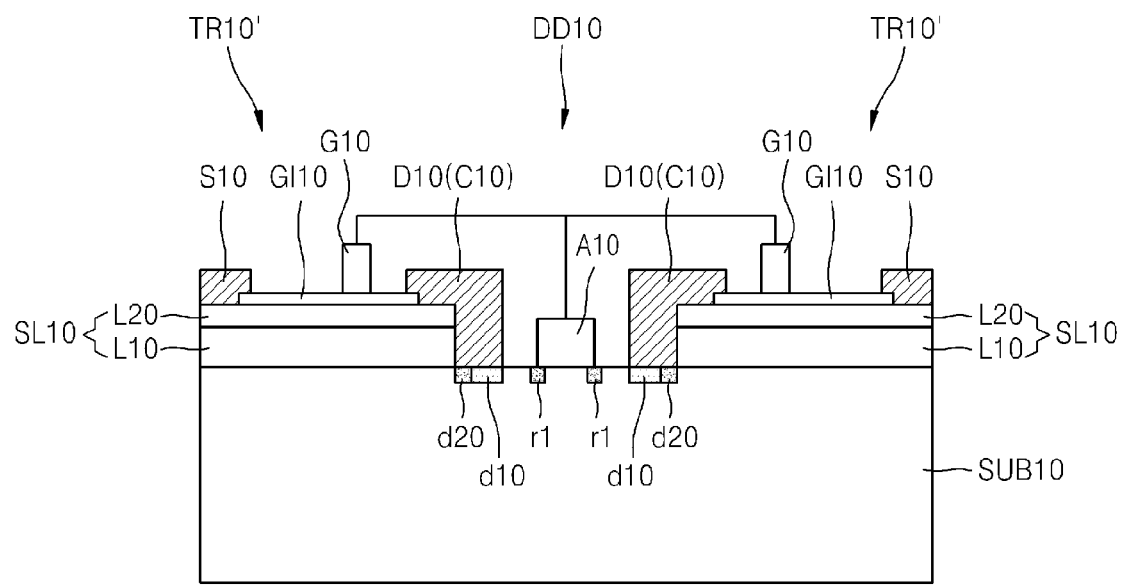
FIG. 6 is a cross-sectional view of a semiconductor device according to example embodiments.

According to example embodiments, other doped regions that contact the doped regions d1 may be further provided, for example as shown in FIG. 6. In this case, the size (width) of each doped region d1 may be somewhat reduced.

Referring to FIG. 6, a first doped region d10 and a second doped region d20 may be formed within a region of the substrate SUB10 below each cathode C10 (e.g., each drain electrode D10). The second doped region d20 may be formed in a region of the substrate SUB10 between the first doped region d10 and the semiconductor layer SL10 adjacent to the first doped region d10. A width of the second doped region d20 may be less than that of the first doped region d10. However, this is only an example, and the widths of the first and second doped regions d10 and d20 may vary. The first doped region d10 may be a region for forming an ohmic contact between the cathode C10 and the substrate SUB10, like the doped region d1 of FIG. 1. Accordingly, the first doped region d10 may be a region doped with the same conductive type of impurities as the conductive type of the substrate SUB10 at a high concentration. The second doped region d20 may have an opposite conductive type to the conductive type of the first doped region d10. In other words, the second doped region d20 may be a region doped with an opposite conductive type of impurities to the conductive type of the substrate SUB10. For example, when the first doped region d10 is an n+ region, the second doped region d20 may be a p+ region. On the other hand, when the first doped region d10 is a p+ region, the second doped region d20 may be an n+ region. Accordingly, the first and second doped regions d10 and d20 may form a PN junction. The second doped region d20 may be positioned between the first doped region d10 and the semiconductor layer SL10 adjacent to the first doped region d10 and thus may block a current flow between the first doped region d10 and the semiconductor layer SL10. In other words, the second doped region d20 may isolate the HEMT TR10' from the diode DD10 within the substrate SUB10. In this respect, the second doped region d20 may be referred to as an isolation region.

The semiconductor devices of FIGS. 1 through 6 may be applied to, for example, power devices. However, application field of the semiconductor devices is not limited to power devices and may be modified in various ways.

In FIGS. 1 through 6, the HEMTs TR10 and TR10' may be normally-on devices. In FIGS. 1 through 6, the HEMT TR10 or TR10' may be cascode-connected to the diode DD10. However, according to example embodiments, a normally-off HEMT may be used, and a method of connecting a HEMT and a diode may be changed. These modified examples will be described below with reference to FIGS. 7 through 12.

Figure 7:
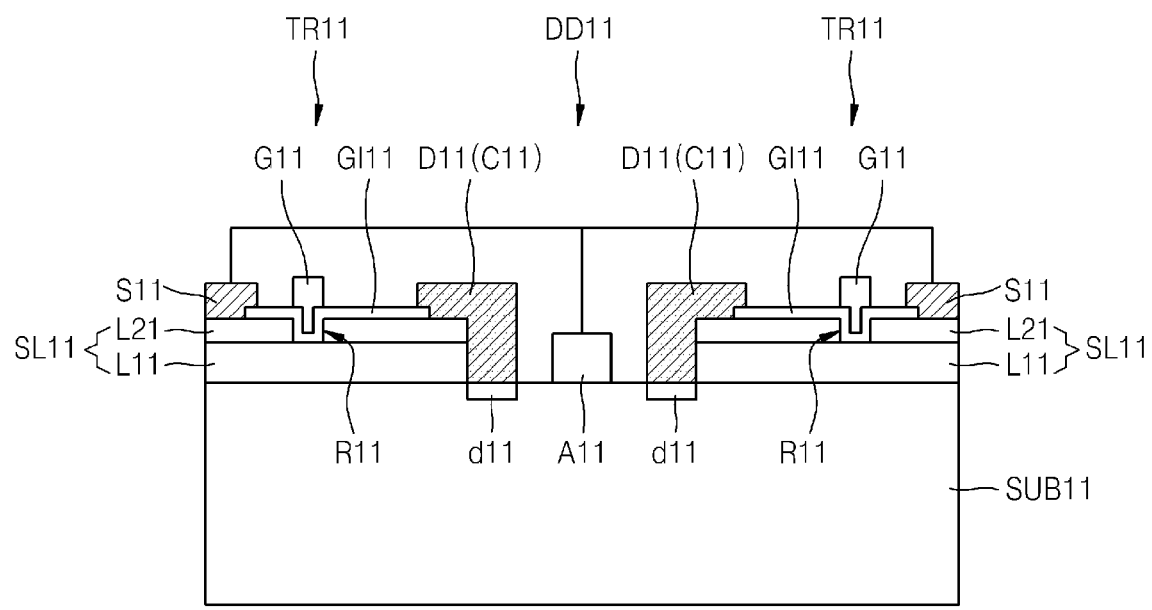
FIG. 7 is a cross-sectional view of a semiconductor device according to example embodiments.

FIG. 7 is a cross-sectional view of a semiconductor device according to example embodiments.

Referring to FIG. 7, at least one semiconductor layer SL11 may be formed on a substrate SUB11. For example, two semiconductor layers SL11 may be formed apart from each other. Each semiconductor layer SL11 may have a multi-layered structure including at least two layers. For example, the semiconductor layer SL11 may include a first layer L11 and a second layer L21. Materials and characteristics of the substrate SUB11, the first layer L11, and the second layer L21 may be the same as or similar to those of the substrate SUB10, the first layer L10, and the second layer L20 of FIG. 1. However, according to example embodiments, a recessed region R11 may be formed in each semiconductor layer SL11. The recessed region R11 may be formed until an interface between the first layer L11 and the second layer L21 or may be formed to be deeper or shallower than the interface. Due to the recessed region R11, a 2DEG (not shown) may be cut at a portion of the first layer L11 (e.g., a channel layer) corresponding to the recessed region R11 or the characteristics of the 2DEG may be changed. Accordingly, HEMTs TR11 included in the semiconductor layers SL11, respectively, may have normally-off characteristics.

Each of the HEMTs TR11 may include a source electrode S11, a drain electrode D11, and a gate electrode G11 formed between the source electrode S11 and the drain electrode D11. Locations and shapes of the source electrode S11 and the drain electrode D11 may be the same as or similar to those of the source electrode S10 and the drain electrode D10 of FIG. 1. A doped region d11 for ohmic contact may be formed in a region of the substrate SUB11 that contacts the drain electrode D11, and the characteristics and functions of the doped region d11 may be the same as or similar to those of the doped region d1 of FIG. 1. The gate electrode G11 may be formed in the recessed region R11 of the semiconductor layer SL11. A gate insulation layer GI11 may be formed between the semiconductor layer SL11 and the gate electrode G11. According to example embodiments, the gate electrode G11 may be arranged closer to the source electrode S11 than to the drain electrode D11. In other words, a distance between the gate electrode G11 and the source electrode S11 may be shorter than that between the gate electrode G11 and the drain electrode D11.

A diode DD11 may be formed on a region of the substrate SUB11 that is not covered with the semiconductor layers SL11. In example embodiments, when two semiconductor layers SL11 are spaced apart from each other, the diode DD11 may be formed on a region of the substrate SUB11 between the two semiconductor layers SL11. The diode DD11 may be a Schottky diode. The diode DD11 may include an anode A11 which forms a Schottky contact with the substrate SUB11. The drain electrode D11 may serve as a cathode C11 of the diode DD11. The anode A11, the cathodes C11 and a region of the substrate SUB11 therebetween may constitute the diode DD11.

The anode A11 of the diode DD11 may be connected to the source electrodes S11 of the HEMTs TR11. The cathode C11 of the diode DD11 may be connected to the drain electrode D11 of the HEMTs TR11. The cathode C11 and the drain electrode D11 corresponding thereto may be considered a single integrated element. The HEMTs TR11 may be formed on both sides of the anode A11, respectively, and may be symmetrical about the anode A11.

Figure 8:
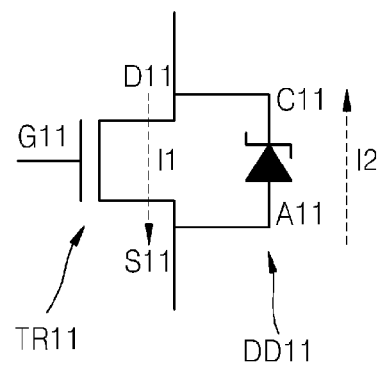
FIG. 8 is a circuit diagram illustrating a connection relationship between a HEMT and a diode illustrated in FIG. 7.

FIG. 8 is a circuit diagram illustrating a connection relationship between the HEMT TR11 and the diode DD11 of FIG. 7.

Referring to FIG. 8, the anode A11 of the diode DD11 may be connected to the source electrode S11 of the HEMT TR11, and the cathode C11 of the diode DD11 may be connected to the drain electrode D11 of the HEMT TR11. A current I1 in the HEMT TR11 may flow from the drain electrode D11 to the source electrode S11, and a current I2 in the diode DD11 may flow from the anode A11 to the cathode C11. When the current I1 flowing from the drain electrode D11 to the source electrode S11 is referred as a forward current, the current I2 flowing from the anode A11 to the cathode C11 may be referred as a reverse current. A combination of the HEMT TR11 and the diode DD11 (e.g., a combination device) as in FIG. 8 may be applied to, for example, power devices. In this case, the diode DD11 may be a free wheeling diode (FWD). The diode DD11 may have the characteristics of a fast recovery diode (FRD). When a semiconductor circuit such as a power device is constructed using a HEMT, a diode capable of serving as an FWD (or an FRD) may be included (and/or required). In such a circuit as FIG. 8, it may be advantageous that the HEMT TR11 has normally-off characteristics, because a forward current in such a circuit of FIG. 8 is controlled by the HEMT TR11. The case where the HEMT TR11 has normally-off characteristics may contribute to easy operation of a semiconductor device and a reduction in power consumption.

According to example embodiments, since the HEMT TR11 and the diode DD11 are formed on the single substrate SUB11 and constitute a combination device as illustrated in FIG. 7, the corresponding semiconductor device may be easily manufactured at reduced costs and may be easily scaled down. If a semiconductor device having such a circuit structure as illustrated in FIG. 8 is manufactured by forming a HEMT and a diode on a first substrate and a second substrate, respectively, and then connecting the HEMT and the diode to each other in a packaging stage, the manufacturing costs thereof may increase, and a size of a packaged device may increase. However, comparatively, according to example embodiments, manufacturing costs may decrease and a size of a packaging device may decrease by forming a HEMT TR11 and a diode DD11 on a single substrate SUB11.

Figure 9:
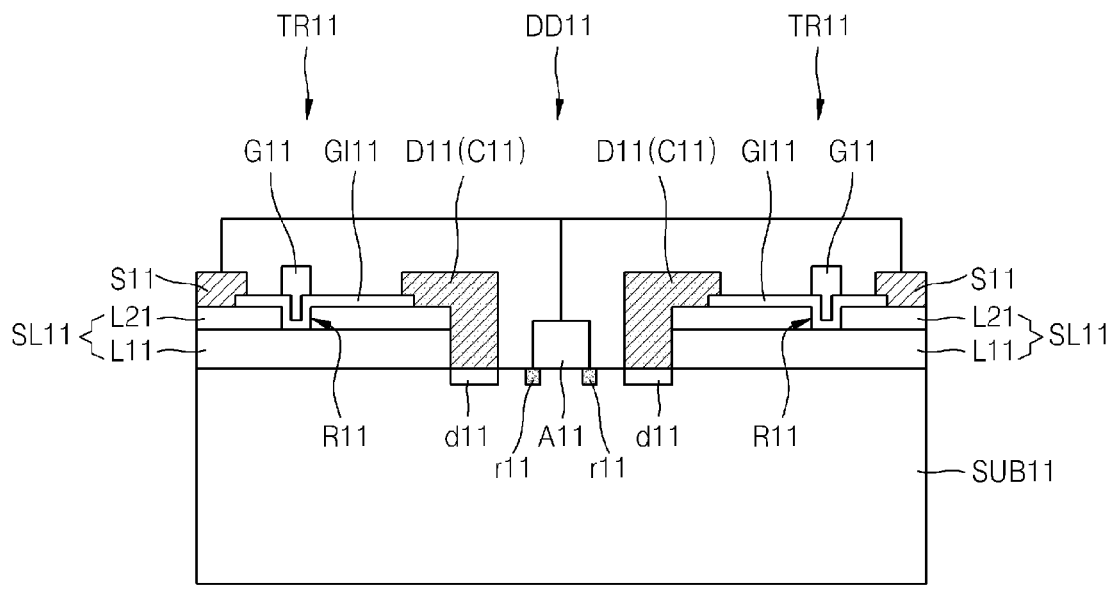
FIG. 9 is a cross-sectional view of a semiconductor device according to example embodiments.

According to example embodiments, for example as illustrated in FIG. 9, impurity regions may be further included in regions of the substrate SUB11 corresponding to edge portions of the anode A11 in the structure of FIG. 7.

Referring to FIG. 9, impurity regions r11 may be formed in regions of the substrate SUB11 corresponding to both edge portions of the anode A11. The impurity regions r11 may be regions doped with an opposite type of impurities to the conductive type of the substrate SUB11 at a high concentration. When the substrate SUB11 is n-type, the impurity regions r11 may be a p+ region. When the substrate SUB11 is p-type, the impurity regions r11 may be an n+ region. The functions and characteristics of the impurity regions r11 may be the same as or similar to those of the impurity regions r1 of FIG. 5.

Figure 10:
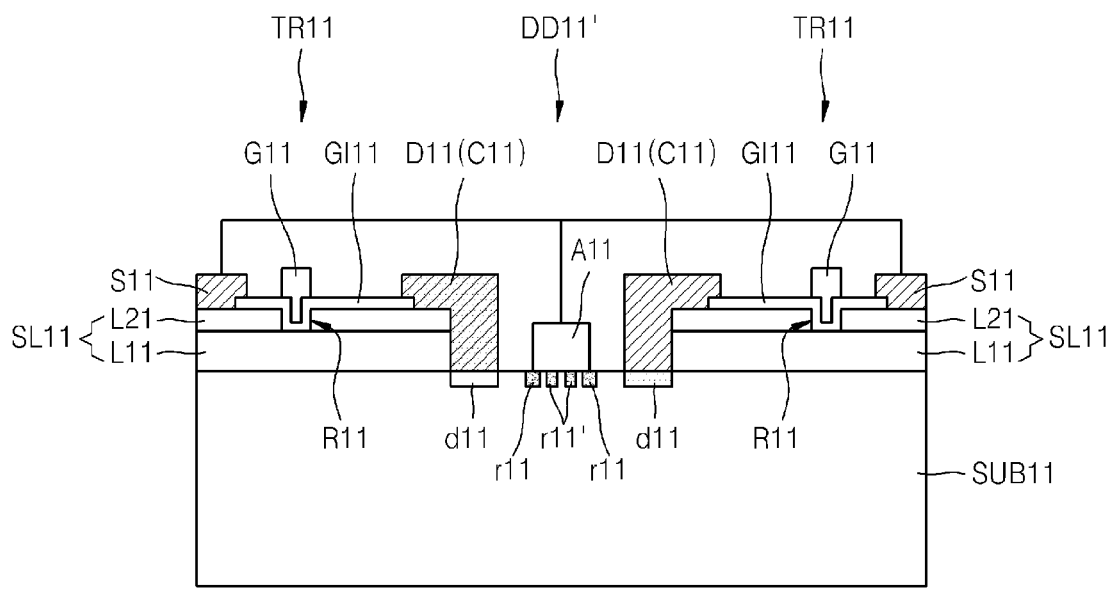
FIG. 10 is a cross-sectional view of a semiconductor device according to example embodiments.

According to example embodiments, for example as shown in FIG. 10, at least one additional impurity region may be further included between the two impurity regions r11 of FIG. 9.

Referring to FIG. 10, at least one additional impurity regions r11' may be further formed in a region of the substrate SUB11 between the both edge portions of the anode A11. When the impurity regions r11 corresponding to the both edge portions of the anode A11 are referred to as first and second impurity regions, respectively, the additional impurity regions r11' (e.g., a third impurity region) may be further included between the first and second impurity regions r11. The additional impurity regions r11' may be regions doped with the same impurities as those with which the impurity regions r11 are doped. In other words, the additional impurity regions r11' may be substantially the same as the impurity regions r11. Due to the inclusion of the additional impurity regions r11', a diode DD11' may have the construction of a junction barrier Schottky (JBS) diode. As such, the inclusion of the additional impurity regions r11' may contribute to an increase in a withstand voltage and a reduction in leakage current. The additional impurity regions r11' may also be applied to the semiconductor devices of FIGS. 1 through 6.

Figure 11:
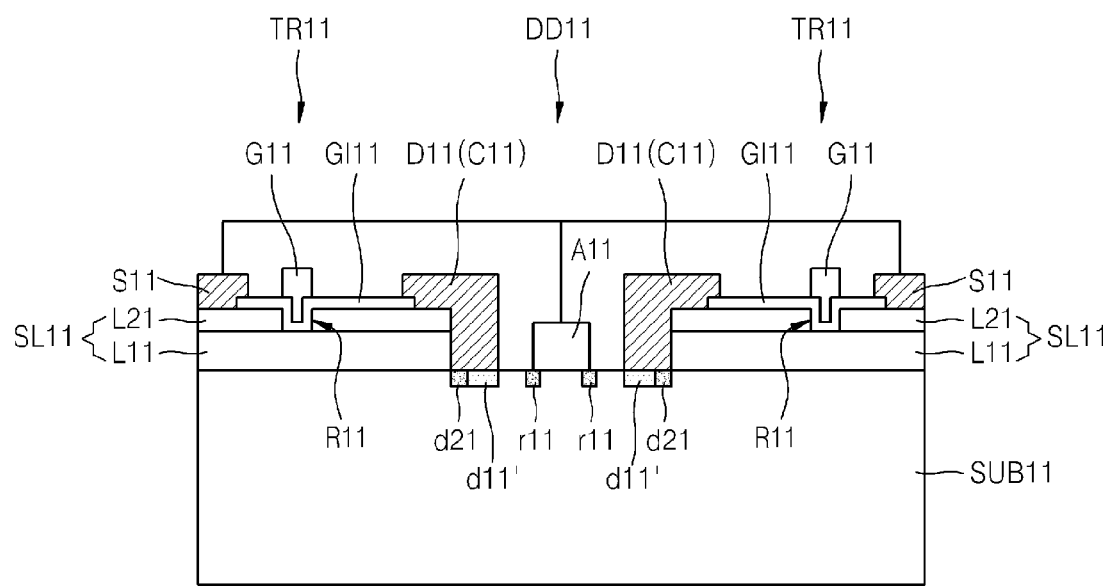
FIG. 11 is a cross-sectional view of a semiconductor device according to example embodiments.

According to example embodiments, for example as shown in FIG. 11, the first doped region d10 and the second doped region d20 of FIG. 6 may be formed in a region of the substrate SUB11 below the cathode C11, namely, the drain electrodes D11.

Referring to FIG. 11, a first doped region d11' and a second doped region d21 may be included within a region of the substrate SUB11 below each cathode C11 (e.g., each drain electrode D11). The first and second doped regions d11' and d21 may be substantially the same as the first and second doped regions d10 and d20 of FIG. 6. Accordingly, a detailed description of the first and second doped regions d11' and d21 is omitted.

Figure 12:
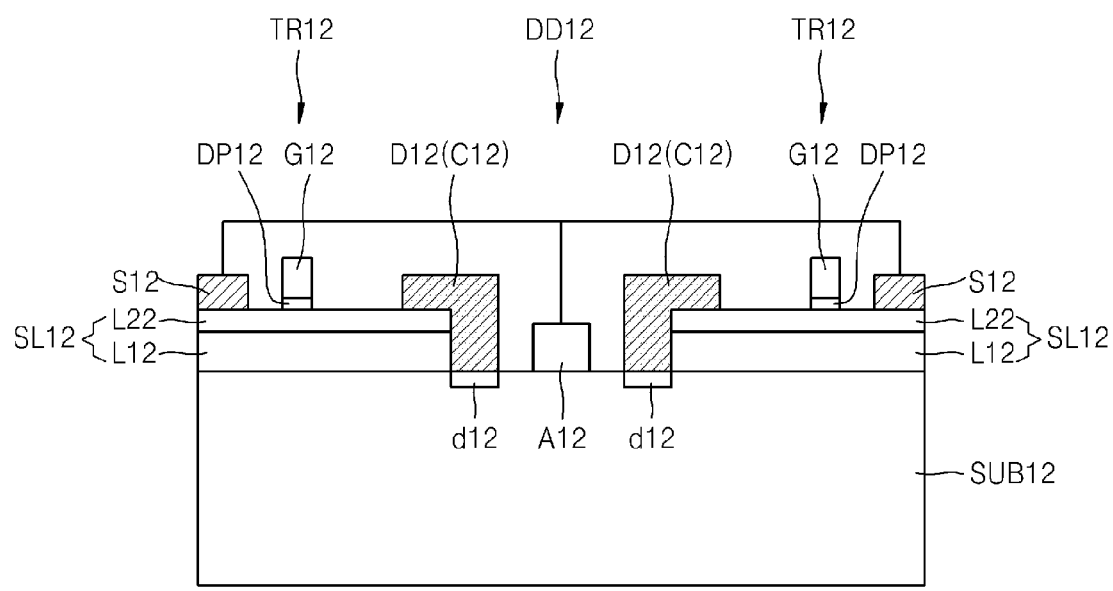
FIG. 12 is a cross-sectional view of a semiconductor device according to example embodiments.
Figure 13:
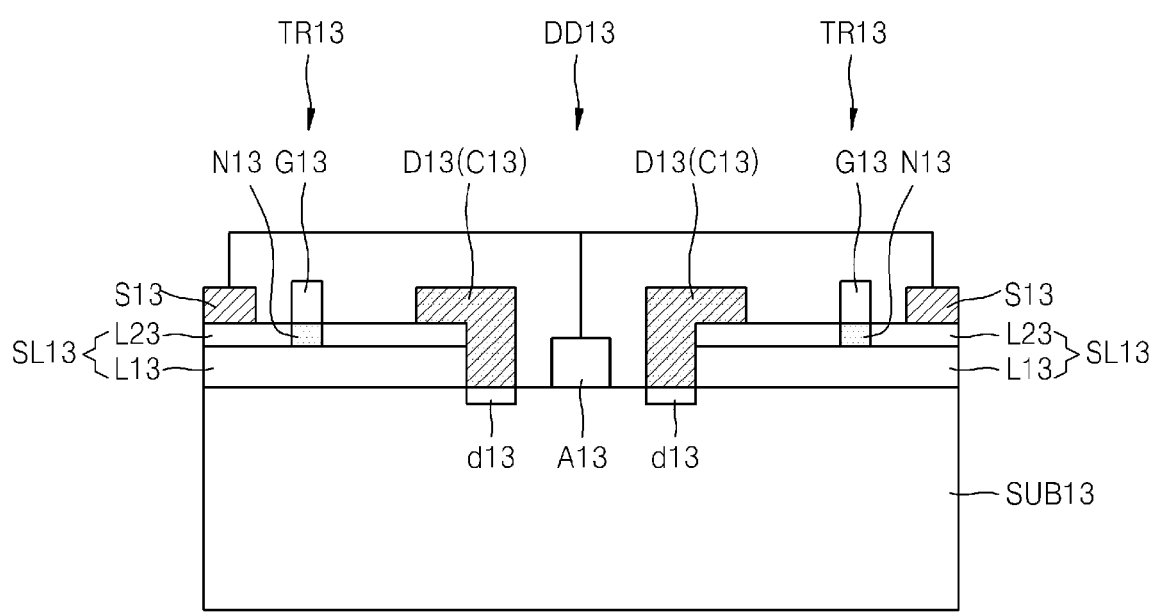
FIG. 13 is a cross-sectional view of a semiconductor device according to example embodiments.

Although the HEMT TR11 having normally-off characteristics is implemented by using the recessed region R11 in FIGS. 7 and 9 through 11, a normally-off HEMT may be implemented according to various methods. For example, a HEMT having normally-off characteristics may be implemented by using a depletion forming layer or an ion-implanted region. The two examples are illustrated in FIGS. 12 and 13. FIG. 12 illustrates a case where a depletion forming layer DP12 is used, and FIG. 13 illustrates a case where an ion-implanted region N13 is used.

FIG. 12 is a cross-sectional view of a semiconductor device according to example embodiments.

Referring to FIG. 12, the depletion forming layer DP12 may be formed between a semiconductor layer SL12 and a gate electrode G12. The depletion forming layer DP12 may be a p-type semiconductor layer or a layer doped with p-type impurities (e.g., a p-doped layer). The depletion forming layer DP12 may include a group III-V based nitride semiconductor. For example, the depletion forming layer DP12 may include at least one of GaN, AlGaN, InN, AlInN, InGaN, and AlInGaN, and may be doped with p-type impurities such as Mg. For example, the depletion forming layer DP12 may be a p-GaN layer or a p-AlGaN layer. The depletion forming layer DP12 may form a depletion region in a 2DEG (not shown) that is induced in a first layer L12 by a second layer L22. The depletion forming layer DP12 may increase the energy bandgap of a portion of the second layer L22 below the depletion forming layer DP12. Consequently, a depletion region may be formed in the 2DEG at a portion of the first layer L12 (e.g., a channel layer) that corresponds to the depletion forming layer DP12. Accordingly, the 2DEG portion of the first layer L12 corresponding to the depletion forming layer DP12 may be cut or may have different characteristics (for example, an electron concentration) from the other portion. Accordingly, each HEMT TR12 according to example embodiments may have normally-off characteristics. Reference numerals S12, D12, d12, C12, A12, and DD12 in FIG. 12 denote a source electrode, a drain electrode, a doped region, a cathode, an anode, and a diode, respectively.

FIG. 13 is a cross-sectional view of a semiconductor device according to example embodiments.

Referring to FIG. 13, the ion-implanted region N13 may be formed in a portion of a semiconductor layer SL13, and a gate electrode G13 may be formed to correspond to the ion-implanted region N13. A gate insulation layer (not shown) may be further included between the ion-implanted region N13 and the gate electrode G13. The ion-implanted region N13 may be doped with ions of impurities such as argon (Ar) or nitrogen (N). The ion-implanted region N13 may be formed into a first layer L13, or formed until an interface between the first layer L13 and a second layer L23, or formed to be shallower than the interface. Since the second layer L23 or both the first and second layers L13 and L23 may be amorphized (e.g., converted from a crystalline material into an amorphous material) due to impurity ion-implantation, the ion-implanted region N13 may be an amorphous region. Accordingly, no 2DEG is formed in the portion of the semiconductor layer SL13 where the ion-implanted region N13 is formed, or the characteristics of a 2DEG may change. Accordingly, each HEMT TR13 according to example embodiments may have normally-off characteristics. Reference numerals S13, D13, d13, C13, A13, and DD13 in FIG. 13 denote a source electrode, a drain electrode, a doped region, a cathode, an anode, and a diode, respectively.

At least one of the impurity regions r11 and r11' of FIG. 10 and the first and second doped regions d11' and d21 of FIG. 11 may be applied to the semiconductor devices according to example embodiments of FIGS. 12 and 13.

Although the formations of the HEMTs TR11, TR12, and TR13 having normally-off characteristics by using the recessed region R11 of FIG. 7, the depletion forming layer DP12 of FIG. 12, and the ion-implanted region N13 of FIG. 13, respectively, have been illustrated herein, an normally-off HEMT may be implemented according to the other methods and may be applied to semiconductor devices according to example embodiments.

Methods of manufacturing a semiconductor device, according to example embodiments will now be described with reference to FIGS. 14A through 18.

FIGS. 14A through 14E are cross-sectional views for explaining a method of manufacturing a semiconductor device, according to example embodiments.

Figure 14A:
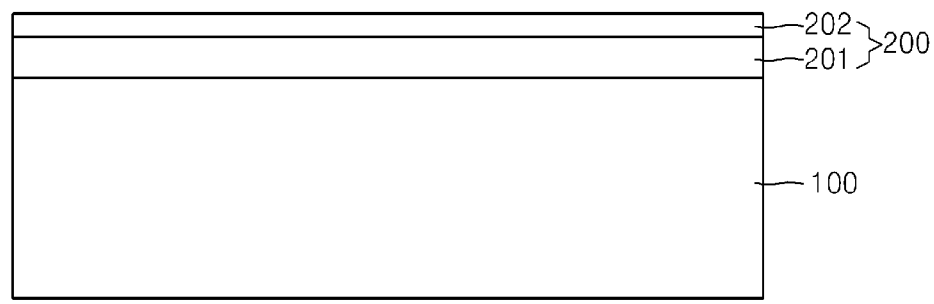
FIGS. 14A through 14E are cross-sectional views for explaining a method of manufacturing a semiconductor device, according to example embodiments.

Referring to FIG. 14A, a semiconductor material layer 200 may be formed on a substrate 100. For example, the substrate 100 may be a silicon substrate. The substrate 100 may be an n-type silicon substrate (e.g., an n-Si substrate) or a p-type silicon substrate (e.g., a p-Si substrate). The semiconductor material layer 200 may include a group III-V based semiconductor. For example, the semiconductor material layer 200 may include a gallium nitride (GaN) based material (semiconductor). The semiconductor material layer 200 may have a multi-layered structure including at least two layers. The semiconductor material layer 200 may include a first layer 201 and a second layer 202. The first layer 201 may be formed between the substrate 100 and the second layer 202. The first layer 201 may include a GaN-based material (e.g., GaN). In this case, the first layer 201 may be an undoped GaN layer, but in some cases, the first layer 201 may be a GaN layer doped with impurities. The second layer 202 may be a layer that induces a 2DEG (not shown) within the first layer 201. The second layer 202 may include a material (semiconductor) having different polarization characteristics and/or a different energy bandgap and/or a different lattice constant from the first layer 201. The second layer 202 may include a material (semiconductor) having higher polarizability and/or a larger energy bandgap than the first layer 201. For example, the second layer 202 may have a mono-layered or multi-layered structure including at least one material selected from nitrides containing at least one of Al, Ga, In, and B. For example, the second layer 202 may have a mono-layered or multi-layered structure including at least one of various materials, such as, AlGaN, AlInN, InGaN, AlN, and AlInGaN. The second layer 202 may be an undoped layer, but in some cases, the second layer 202 may be a layer doped with impurities. A thickness of the second layer 202 may be several tens of nm or less. For example, the thickness of the second layer 202 may be about 50 nm or less. The first layer 201 and the second layer 202 may be formed using an epitaxial process, and in this case, a chemical vapor deposition (CVD) method may be used, for example. However, the materials and methods used to form the first layer 201 and the second layer 202 are not limited to what stated above and may vary.

Figure 14B:
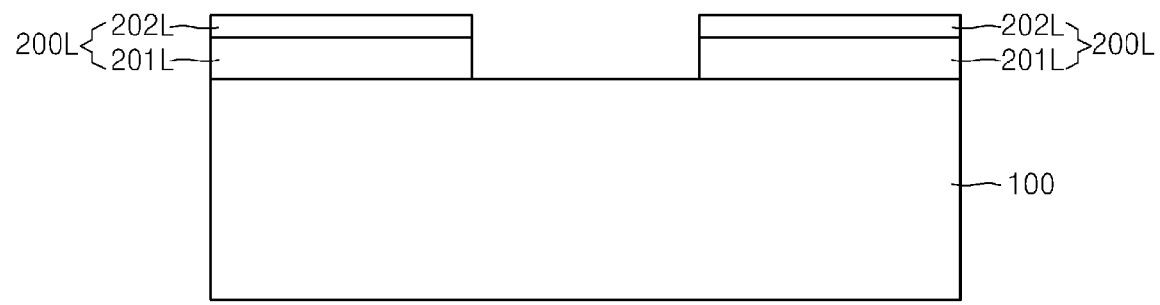

A portion of the semiconductor material layer 200 may be etched (or patterned) to expose a region of the substrate 100. A result of the etching is illustrated in FIG. 14B. Referring to FIG. 14B, a plurality of semiconductor layers 200L separated from each other may be formed via the patterning of the semiconductor material layer 200 of FIG. 14A. The semiconductor layers 200L may include at least two semiconductor layers (that is, first and second semiconductor layers), and the region of the substrate 100 therebetween may be exposed. Reference numerals 201L and 202L in FIG. 14B denote patterned first and second layers, respectively.

Figure 14C:
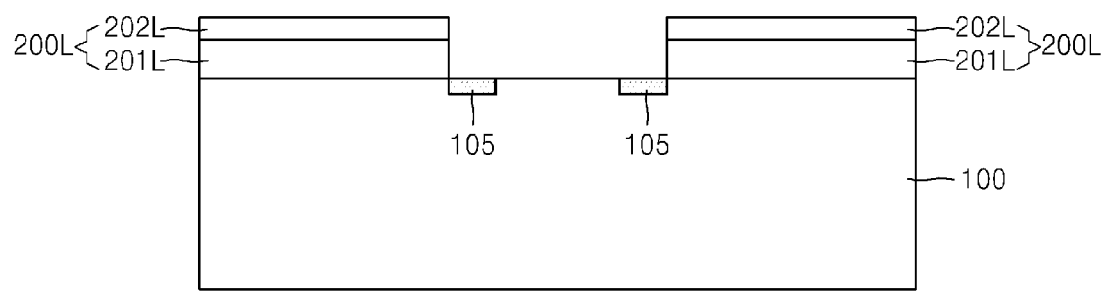

Referring to FIG. 14C, impurities may be doped on both ends of an exposed region of the substrate 100 to form doped regions 105. The doped regions 105 may be formed by doping the both ends of the exposed region of the substrate 100 with the same type of impurities as the conductive type of the substrate 100 at a high concentration. When the substrate 100 is n-type, the doped regions 105 may be n+ regions. When the substrate 100 is p-type, the doped regions 100 may be p+ regions.

Figure 14D:
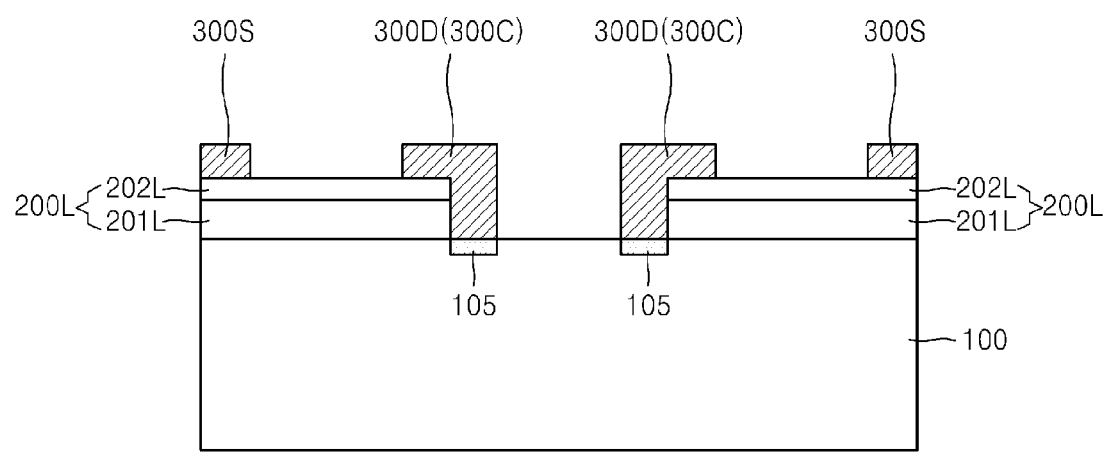

Referring to FIG. 14D, a source electrode 300S and a drain electrode 300D may be formed to contact each semiconductor layer 200L. The source electrode 300S may be formed on an upper surface of the semiconductor layer 200L and thus may be spaced apart from the substrate 100. The drain electrode 300D may extend over the semiconductor layer 200L while contacting a corresponding doped region 105. The drain electrode 300D and the substrate 100 may ohmic-contact with each other by the doped region 105. The two drain electrodes 300D may be spaced apart from each other, and a region of the substrate 100 therebetween may be exposed. The drain electrodes D10 may serve as cathodes 300C of a diode DD15 (see FIG. 14E), which will be formed later. This will be described later in detail.

Figure 14E:
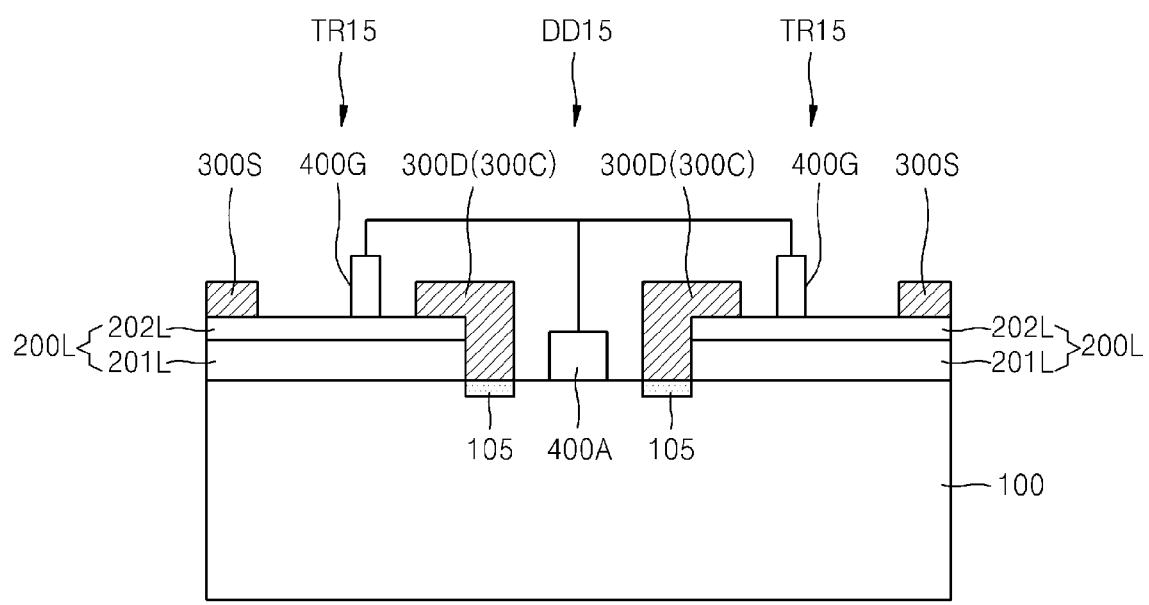

Referring to FIG. 14E, an anode 400A may be formed in the region of the substrate 100 exposed between the two drain electrodes 300D, and a gate electrode 400G may be formed on a region of the semiconductor layer 200L between the source electrode 300S and the drain electrode 300D. The anode 400A and the gate electrode 400G may be formed to be connected to each other. For example, the anode 400A and the gate electrode 400G may be formed to have the same structures as those of the anode A10 and the gate electrode G10 of FIG. 2, respectively. The anode 400A and the gate electrode 400G may be formed of the same material and at the same time. The anode 400A may form a Schottky contact with the substrate 100. The gate electrode 400G may be disposed closer to the drain electrode 300D than the source electrode 300S.

The anode 400A and a region of the substrate 100 that contacts the anode 400A may constitute the diode DD15. When the anode 400A forms a Schottky contact with the substrate 100, the diode DD15 may be a Schottky diode. The drain electrodes 300D may serve as cathodes 300C of the diode DD15. Accordingly, the drain electrodes 300D may be referred to as the cathodes 300C. The source electrode 300S, the drain electrode 300D, and the gate electrode 400G together with the semiconductor layer 200L may constitute a HEMT TR15. The diode DD15 and the HEMT TR15 may have a connection relationship as illustrated in FIG. 3. In this case, the diode DD15 and the HEMT TR15 may be cascode-connected to each other.

FIGS. 15A through 15D are cross-sectional views for explaining a method of manufacturing a semiconductor device, according to example embodiments.

Figure 15A:
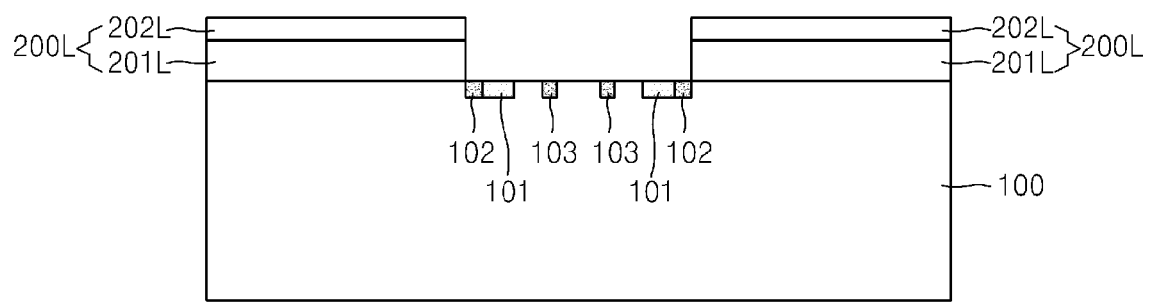
FIGS. 15A through 15D are cross-sectional views for explaining a method of manufacturing a semiconductor device, according to example embodiments.

Referring to FIG. 15A, after forming the structure as shown in FIG. 14B, a first doped region 101 and a second doped region 102 may be formed on either end of the region of the substrate 100 exposed between the semiconductor layers 200L. The second doped region 102 on either end of the exposed region of the substrate 100 may be located between the first doped region 101 and the semiconductor layer 200L adjacent to the first doped region 101. The first doped region 101 may be a region doped with impurities of the same conductive type as that of the doped region 105 of FIG. 14C. The second doped region 102 may be a region doped with impurities of an opposite conductive type to that of the first doped region 101. When the first doped region 101 is an n+ region, the second doped region 102 may be a p+ region. On the other hand, when the first doped region 101 is a p+ region, the second doped region 102 may be an n+ region. Accordingly, the first and second doped regions 101 and 102 may form a PN junction.

A plurality of impurity regions 103 may be formed in a region of the substrate 100 between the two first doped regions 101. The impurity regions 103 may be formed by doping the region of the substrate 100 between the two first doped regions 101 with impurities of an opposite type to the conductive type of the substrate 100 at a high concentration. Accordingly, the impurity regions 103 may have the same conductive type as the second doped regions 102. In this regard, the impurity regions 103 and the second doped region 102 may be formed simultaneously. When the substrate 100 is n-type, the impurity regions 103 and the second doped regions 102 may be p+ regions. When the substrate 100 is p-type, the impurity regions 103 and the second doped regions 102 may be n+ regions.

Figure 15B:
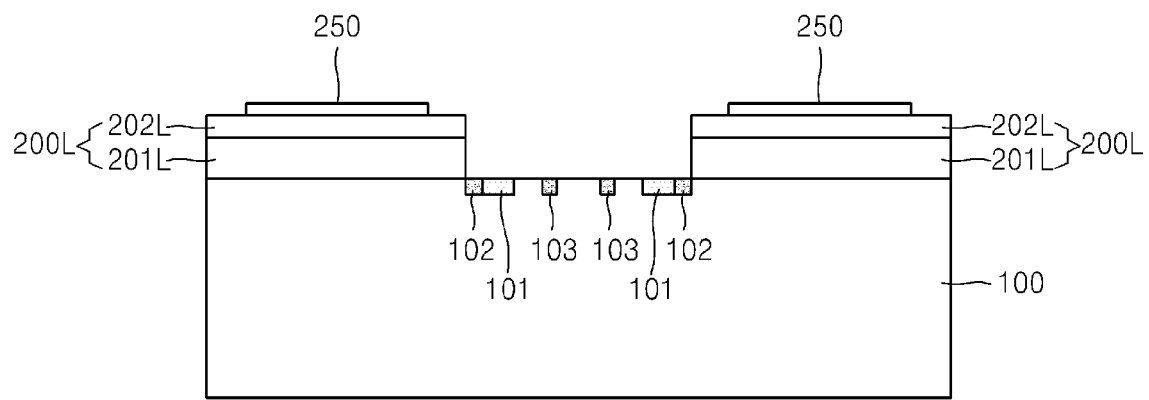

Referring to FIG. 15B, a gate insulation layer 250 may be formed on each semiconductor layer 200L. The gate insulation layer 250 may be formed to include, for example, at least one of $Al_2O_3$, $SiO_x$, $Si_xN_y$, $Sc_2O_3$, AlN, $Ga_2O_3$, $Gd_2O_3$, $AlxGa_{2(1-x)}O_3$, MgO, and a combination of two or more of these materials. Although not stated above, any gate insulation layer material may be used as a material used to form the gate insulation layer 250, as long as it is usable in a general transistor.

Figure 15C:
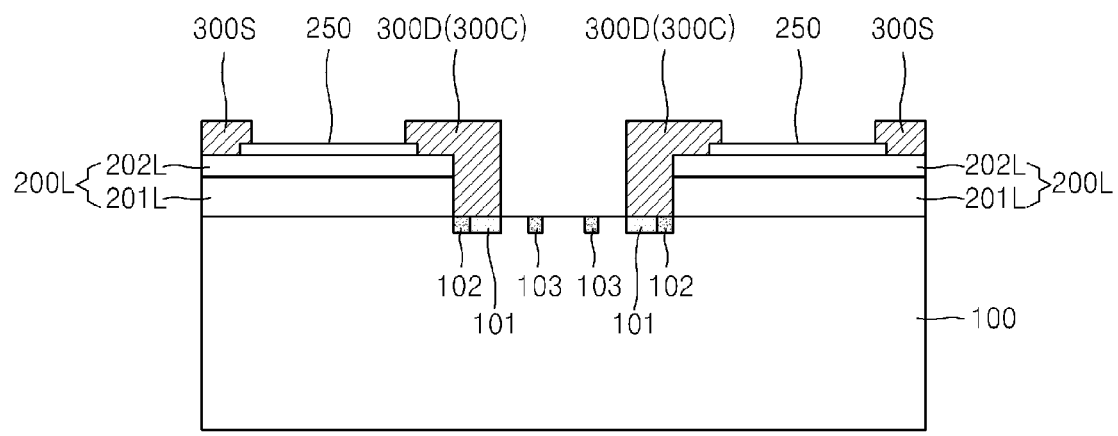

Referring to FIG. 15C, a source electrode 300S and a drain electrode 300D may be formed to contact each semiconductor layer 200L. The drain electrode 300D may extend over the semiconductor layer 200L while contacting corresponding first and second doped regions 101 and 102. The drain electrode 300D and the substrate 100 may ohmic-contact with each other by the doped region 101. The second doped region 102 may be positioned between the first doped region 101 and the semiconductor layer 200L adjacent to the first doped region 101 and thus may block (or reduce) a current flow between the first doped region 101 and the semiconductor layer 200L. In this respect, the second doped region 102 may be referred to as an isolation region.

Figure 15D:
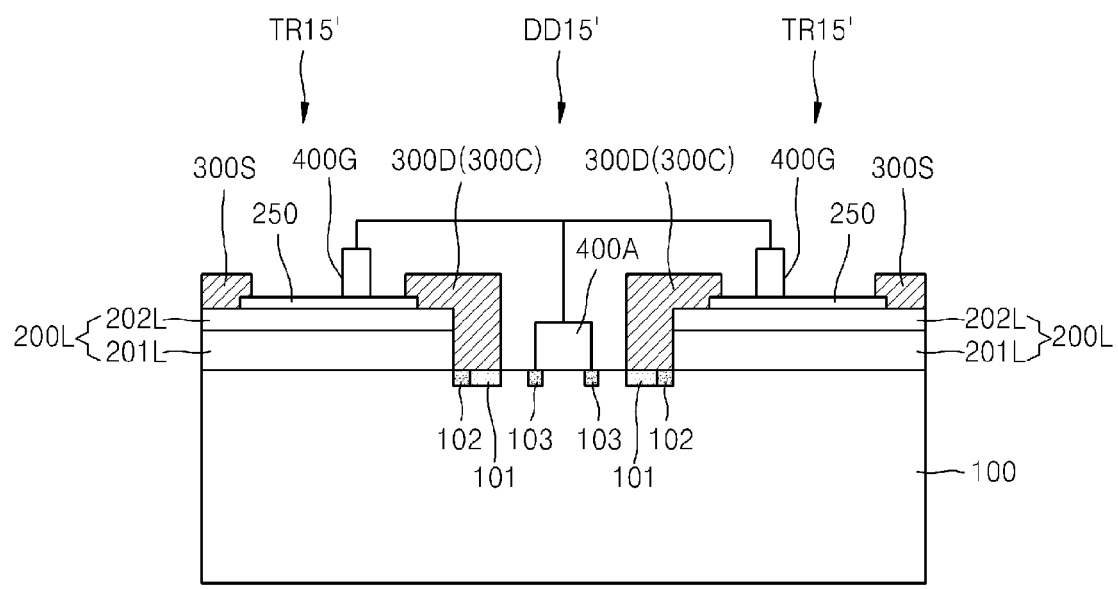

Referring to FIG. 15D, an anode 400A may be formed in the region of the substrate 100 exposed between the two drain electrodes 300D, and a gate electrode 400G may be formed on the region of the semiconductor layer 200L between the source electrode 300S and the drain electrode 300D. The anode 400A may be formed so that its both edges correspond to the impurity regions 103. An electric field may concentrate on the regions of the substrate 100 corresponding to both edges of the anode 400A, and the concentration of the electric field may be reduced (or effectively prevented) by the impurity regions 103 formed in the regions of the substrate 100 corresponding both edges of the anode 400A. The anode 400A and the gate electrode 400G may be formed to be connected to each other. The anode 400A and the gate electrode 400G may be formed of the same material and at the same time.

Figure 16A:
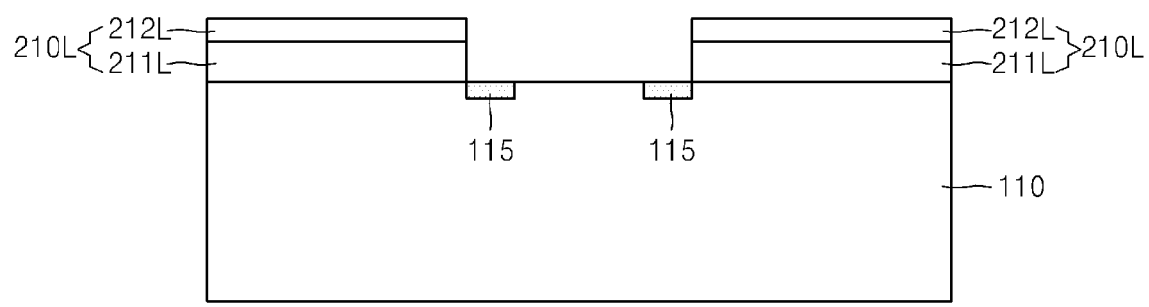
FIGS. 16A through 16D are cross-sectional views for explaining a method of manufacturing a semiconductor device, according to example embodiments.

FIGS. 16A through 16D are cross-sectional views for explaining a method of manufacturing a semiconductor device, according to example embodiments;

Referring to FIG. 16A, at least one semiconductor layer 210L may be formed on a substrate 110. The semiconductor layers 210L may be formed apart from each other, and a region of the substrate 110 therebetween may be exposed. Each semiconductor layer 210L may include a first layer 211L and a second layer 212L. A method of forming the semiconductor layers 210L may be the same as or similar to the method of forming the semiconductor layers 200L described above with reference to FIGS. 14A and 14B. Materials of the first layer 211L and the second layer 212L may be the same as or similar to those of the first layer 201L and the second layer 202L of FIG. 14B, respectively. Next, doped regions 115 may be formed on both ends of the exposed region of the substrate 110, respectively. The doped regions 115 may be the same as or similar to the doped regions 105 of FIG. 14C.

Figure 16B:
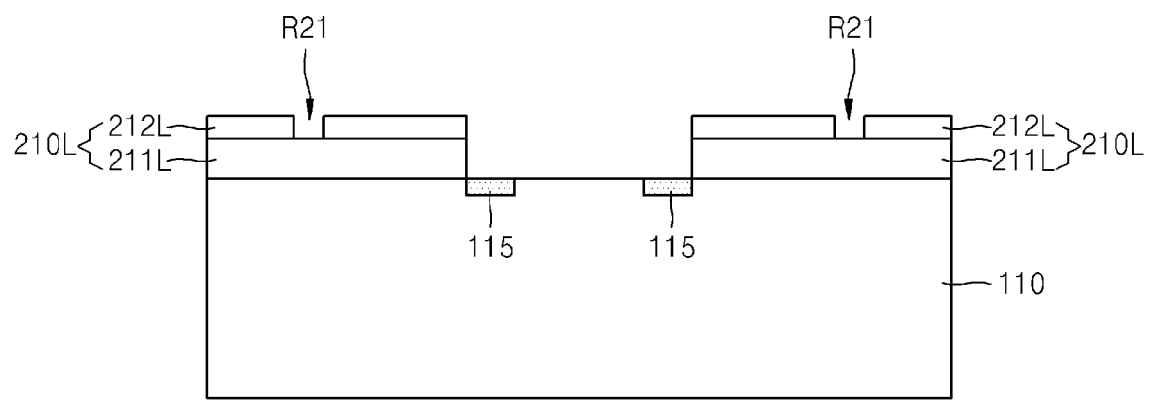

Referring to FIG. 16B, a recessed region R21 may be formed by etching a portion of each semiconductor layer 210L. The recessed region R21 may be formed until an interface between the first layer 211L and the second layer 212L or may be formed to be deeper or shallower than the interface. Due to the recessed region R21, a 2DEG (not shown) may be cut at a portion of the first layer 211L (e.g., a channel layer) corresponding to the recessed region R11 or the characteristics of the 2DEG may be changed.

Figure 16C:
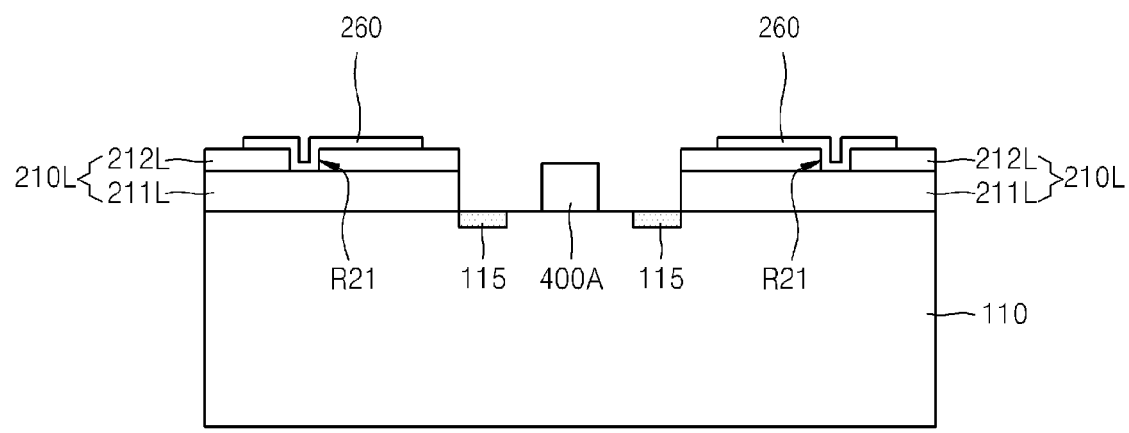

Referring to FIG. 16C, a gate insulation layer 260 covering the recessed region R21 may be formed on the semiconductor layer 210L. The gate insulation layer 260 may be formed of a material the same as or similar to that used to form the gate insulation layer 250 of FIG. 15B.

Figure 16D:
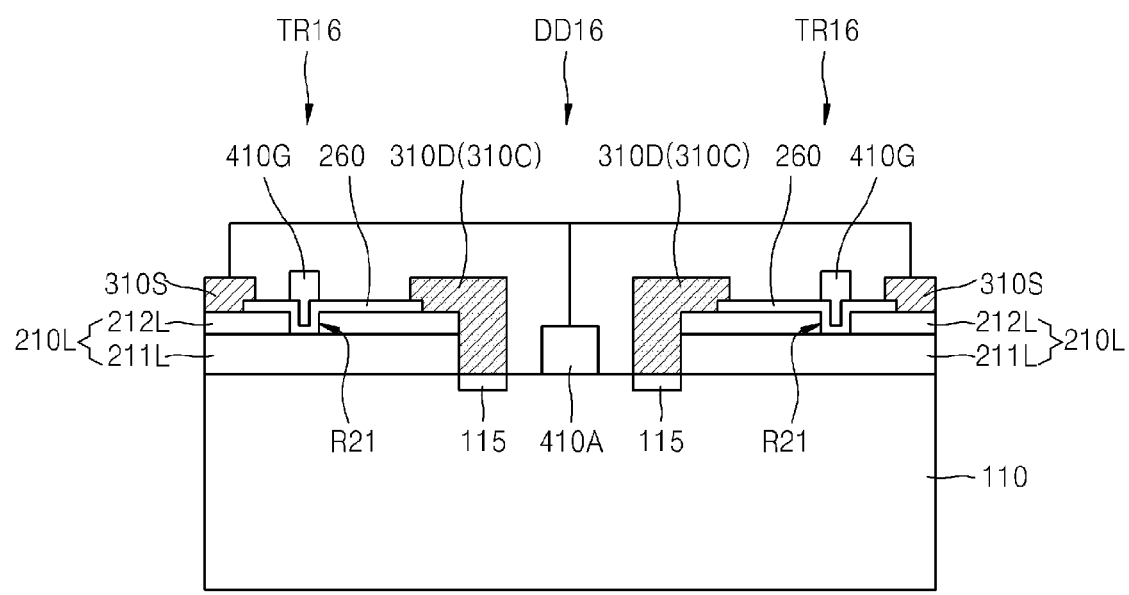

Referring to FIG. 16D, a source electrode 310S and a drain electrode 310D may be formed to contact each semiconductor layer 210L. The source electrode 310S may be formed on the semiconductor layer 210L and thus may be spaced apart from the substrate 110. A drain electrode 310D may extend over the semiconductor layer 210L while contacting the corresponding doped region 115. The drain electrode 310D and the substrate 110 may ohmic-contact with each other by the doped region 115.

Next, an anode 410A may be formed in a region of the substrate 110 exposed between the two drain electrodes 310D, and a gate electrode 410G may be formed on a region of the gate insulation layer 260 between the source electrode 310S and the drain electrode 310D. The gate electrode 410G may be formed in the recessed region R21. The gate electrode 410G may be disposed closer to the source electrode 310S than the drain electrode 310D. In other words, a distance between the gate electrode 410G and the source electrode 310S may be shorter than that between the gate electrode 41G and the drain electrode 310D. The anode 410A may be formed to be connected to the source electrode 310S.

The anode 410A and a region of the substrate 110 that contacts the anode 410A may constitute a diode DD16. The drain electrodes 310D may serve as cathodes 310C of the diode DD16. Therefore, it may be considered that the cathode 310C of the diode DD16 and the drain electrode 310D corresponding thereto are integrally formed in one body. The source electrode 310S, the drain electrode 310D, and the gate electrode 410G together with the semiconductor layer 210L may constitute a HEMT TR16. The diode DD16 and the HEMT TR16 may have a connection relationship as illustrated in FIG. 8.

The first and second doped regions 101 and 102 and the impurity regions 103 of FIG. 15A may be formed in the exposed region of the substrate 110 illustrated in FIG. 16A. Thereafter, subsequent processes may be performed. A result thereof is illustrated n FIG. 17.

Figure 17:
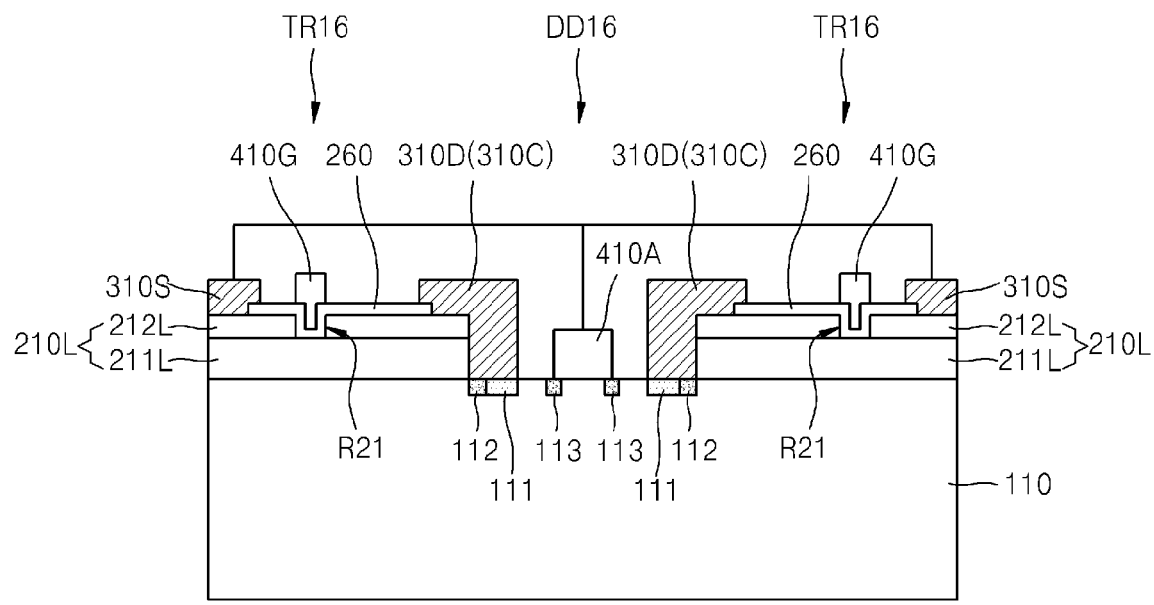
FIG. 17 is a cross-sectional view for explaining a method of manufacturing a semiconductor device, according to example embodiments.

Referring to FIG. 17, first and second doped regions 111 and 112 may be formed in regions of the substrate 110 that correspond to the drain electrodes 310D, and impurity regions 113 may be formed in regions of the substrate 110 that correspond to both edges of the anode 410A, respectively. Locations and functions of the first and second doped regions 111 and 112 and the impurity regions 113 may be the same as or similar to those of the first and second doped regions 101 and 102 and the impurity regions 103 of FIG. 15C.

Figure 18:
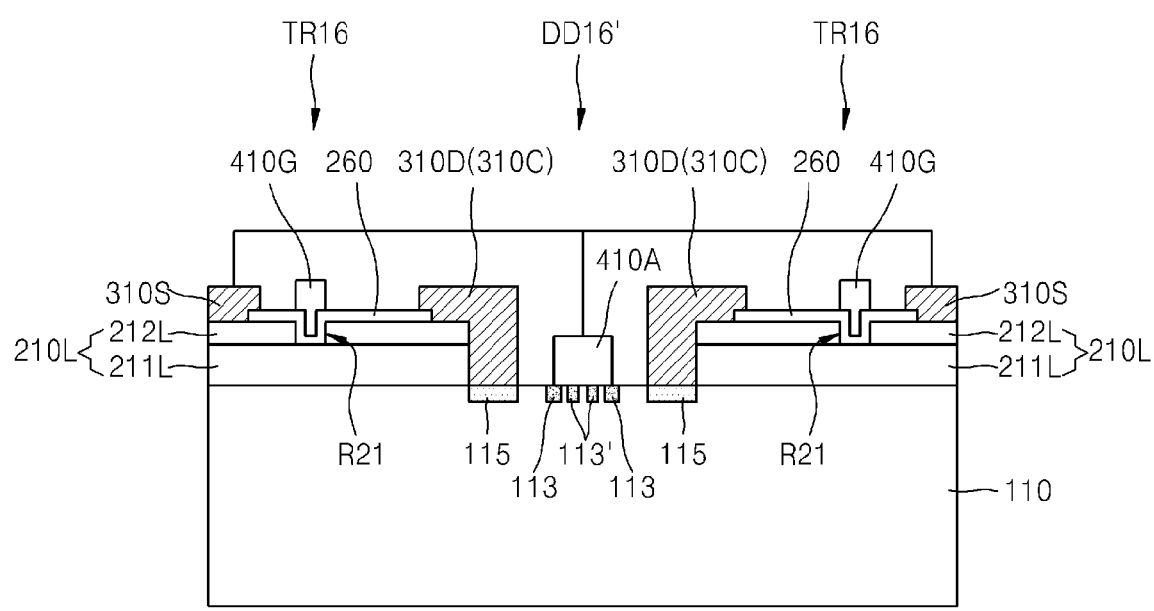
FIG. 18 is a cross-sectional view for explaining a method of manufacturing a semiconductor device, according to example embodiments.

According to example embodiments, for example as shown in FIG. 18, an additional impurity region may be further formed in a region of the substrate 110 between the two impurity regions 113.

Referring to FIG. 18, additional impurity regions 113' may be further formed in a region of the substrate 110 below the anode 410A. At least one additional impurity region 113' may be formed between the additional impurity regions 113 respectively corresponding to both edges of the anode 410A. The additional impurity regions 113' may be regions doped with the same impurities as those with which the impurity regions 113 are doped. The additional impurity regions 113' may be substantially the same as the impurity regions 113. Due to the formation of the additional impurity regions 113', a diode DD16' may have the construction of a junction barrier Schottky (JBS) diode. The additional impurity regions 113' may contribute to an increase in a withstand voltage of the semiconductor device and a reduction in leakage current of the semiconductor device.

Although a HEMT having normally-off characteristics is implemented by using the recessed region R21 in FIGS. 16A through 16D, 17, and 18, a normally-off HEMT may be implemented according to various methods. For example, a HEMT having normally-off characteristics may be obtained by using a depletion forming layer or an ion-implanted region. A resultant structure in which the depletion forming layer is formed may be the same as that of FIG. 12, and a resultant structure in which the ion-implanted region is formed may be the same as that of FIG. 13. Although the formations of HEMTs having normally-off characteristics by using the recessed region R21, the depletion forming layer, and the ion-implanted region, respectively, have been illustrated herein, a normally-off HEMT may be formed according to the other methods and may be applied to semiconductor devices according to example embodiments.

Semiconductor devices according to example embodiments may be applied to, for example, power devices. However, example embodiments are not limited thereto and semiconductor devices according to example embodiments may be modified in various ways.

Example embodiments described herein should be considered in a descriptive sense only and not for purposes of limitation. For example, it will be understood by one of ordinary skill in the art that various changes in form and details may be made in the structures of the semiconductor devices of FIGS. 1 through 13 without departing from the spirit and scope of the following claims. For example, materials other than a GaN-based material may be used as the materials used to form a channel layer and a channel supply layer in a HEMT, and materials other than a GaN-based material may also be used as the material used to form a diode. In addition, the connection relationship between the HEMT and the diode may vary. Moreover, various changes may be made in the semiconductor device manufacturing methods of FIGS. 14A through 18. Therefore, while some example embodiments have been particularly shown and described, it will be understood by one of ordinary skill in the art that variations in forms and detail may be made without departing from the spirit and scope of the claims.

What is claimed is:

1. A semiconductor device comprising:
    a substrate;
    a high electron mobility transistor (HEMT) on a first region of the substrate,
        the HEMT including a semiconductor layer; and
    a diode on a second region of the substrate, the diode being electrically connected to the HEMT,
        the diode including an anode contacting the substrate and a cathode that is spaced apart from the anode in a horizontal direction,
        the anode being spaced apart from the semiconductor layer, and
        the cathode being between the anode and the semiconductor layer.

2. The semiconductor device of claim 1, wherein the HEMT includes:
    a source electrode electrically connected to a first region of the semiconductor layer;
    a drain electrode electrically connected to a second region of the semiconductor layer; and
    a gate electrode on the semiconductor layer between the source electrode and the drain electrode.

3. The semiconductor device of claim 2, wherein an upper surface of the substrate contacts one of the source electrode and the drain electrode.

4. The semiconductor device of claim 3, wherein the source electrode is spaced apart from the substrate, and the drain electrode contacts the substrate and the semiconductor layer.

5. The semiconductor device of claim 1, wherein the semiconductor layer includes a channel layer and a channel supply layer.

6. The semiconductor device of claim 1, wherein the semiconductor layer includes a gallium nitride (GaN)-based material.

7. The semiconductor device of claim 1, wherein the diode is a Schottky diode and the anode forms a Schottky contact with the substrate.

8. The semiconductor device of claim 7, wherein the cathode of the diode is a drain electrode of the HEMT.

9. The semiconductor device of claim 7, wherein the cathode contacts the substrate and the semiconductor layer.

10. The semiconductor device of claim 1, wherein the substrate is a silicon substrate.

11. The semiconductor device of claim 1, wherein the HEMT is a GaN-based HEMT, and the diode is a silicon-based Schottky diode.

12. The semiconductor device of claim 1, wherein the HEMT and the diode are cascode-connected to each other.

13. The semiconductor device of claim 12, wherein
    a gate electrode of the HEMT is connected to an anode of the diode, and
    a drain electrode of the HEMT is a cathode of the diode.

14. The semiconductor device of claim 12, wherein a gate electrode of the HEMT is closer to a drain electrode of the HEMT than to a source electrode of the HEMT.

15. The semiconductor device of claim 12, wherein the HEMT is a normally-on device.

16. The semiconductor device of claim 1, wherein
    a source electrode of the HEMT is connected to an anode of the diode, and
    a drain electrode of the HEMT is a cathode of the diode.

17. The semiconductor device of claim 16, wherein a gate electrode of the HEMT is closer to the source electrode of the HEMT than to the drain electrode of the HEMT.

18. The semiconductor device of claim 16, wherein the HEMT is a normally-off device.

19. The semiconductor device of claim 16, wherein the diode is a free wheeling diode (FWD).

20. A semiconductor device comprising:
    a substrate;
    a first high electron mobility transistor (HEMT) on a first region of the substrate, the first HEMT including a first semiconductor layer on the first region of the substrate,
    a diode on a second region of the substrate, the diode being electrically connected to the first HEMT;
    a second HEMT that is electrically connected to the diode, the second HEMT being on a second region of the substrate, and
    the second HEMT includes a second semiconductor layer that is spaced apart from the first semiconductor layer of the first HEMT.

21. The semiconductor device of claim 20, wherein the first HEMT and the second HEMT are symmetrical about the diode.

22. The semiconductor device of claim 1, further comprising:
a first impurity region in the substrate,
the first impurity region corresponding to a first edge of an anode of the diode;
and a second impurity region in the substrate,
the second impurity region corresponding to a second edge of the anode of the diode.

23. The semiconductor device of claim 22, further comprising:
at least one third impurity region in the substrate,
the at least one third impurity region being between the first impurity region and the second impurity region of the substrate.

24. The semiconductor device of claim 1, further comprising:
a first doped region of a first conductive type in the substrate, wherein
the first doped region is below a cathode of the diode, and
the cathode and the first doped region of the substrate form an ohmic-contact between the cathode and the substrate.

25. The semiconductor device of claim 24, further comprising:
a second doped region of a second conductive type in the substrate, wherein
the second doped region of the substrate is between the first doped region of the substrate and the semiconductor layer of the HEMT, and
the first doped region and the second doped region of the substrate form a PN junction.

26. A power device comprising:
the semiconductor device of claim 1.

27. A method of manufacturing a semiconductor device, the method comprising:
forming a high electron mobility transistor (HEMT) on a first region of a substrate, the HEMT including a semiconductor layer; and
forming a diode on a second region of the substrate, the diode being electrically connected to the HEMT, the forming of the diode including,
forming an anode that contacts the substrate, the anode being arranged apart from the semiconductor layer, and
forming a cathode that is spaced apart from the anode in a horizontal direction, the cathode being between the anode and the semiconductor layer.

28. The method of claim 27, wherein the forming the HEMT includes,
forming a semiconductor material layer on the substrate, and
exposing a region of the substrate by etching a portion of the semiconductor material layer; and
the forming the diode includes forming the diode on the exposed region of the substrate.

29. The method of claim 27, wherein the semiconductor layer includes a channel layer and a channel supply layer.

30. The method of claim 27, wherein the semiconductor layer includes a GaN-based material.

31. The method of claim 27, wherein the forming of the HEMT includes:
forming a source electrode and a drain electrode that are electrically connected to a first region and a second region of the semiconductor layer, respectively; and
forming a gate electrode on the semiconductor layer between the source electrode and the drain electrode.

32. The method of claim 31, wherein
the forming the source electrode includes forming the source electrode arranged apart from the substrate, and
the forming the drain electrode includes forming the drain electrode arranged to contact the substrate and the semiconductor layer.

33. The method of claim 27, wherein the forming the diode includes forming a Schottky diode.

34. The method of claim 33, wherein the forming of the diode includes:
forming an anode that forms a Schottky contact with the substrate; and
forming a cathode that is spaced apart from the anode in a horizontal direction.

35. The method of claim 34, wherein
the forming the anode includes forming the anode arranged apart from the semiconductor layer, and the forming the cathode includes forming the cathode between the anode and the semiconductor layer.

36. The method of claim 34, wherein
the forming the cathode includes forming the cathode to contact the substrate and the semiconductor layer, and
the cathode serves as a drain electrode of the HEMT.

37. The method of claim 27, wherein the substrate is a silicon substrate.

38. The method of claim 27, wherein the forming the HEMT and the forming the diode include forming the HEMT and the diode as cascode-connected to each other.

39. The method of claim 38, wherein
a gate electrode of the HEMT is connected to an anode of the diode, and
a drain electrode of the HEMT is a cathode of the diode.

40. The method of claim 38, wherein the HEMT is a normally-on device.

41. The method of claim 27, wherein
a source electrode of the HEMT is connected to an anode of the diode, and
a drain electrode of the HEMT is a cathode of the diode.

42. The method of claim 41, wherein the HEMT is a normally-off device.

43. The method of claim 41, wherein the diode is a free wheeling diode (FWD).

44. The method of claim 27, wherein
the forming the HEMT on the first region of the substrate includes forming the HEMT as a first HEMT that includes a first semiconductor layer on the first region of the substrate,
the method further includes forming a second HEMT that is on the substrate and electrically connected to the diode, and
the second HEMT includes a second semiconductor layer that is spaced apart from the first semiconductor layer of the first HEMT.

* * * * *